United States Patent
Glass et al.

(10) Patent No.: US 10,734,412 B2
(45) Date of Patent: Aug. 4, 2020

(54) BACKSIDE CONTACT RESISTANCE REDUCTION FOR SEMICONDUCTOR DEVICES WITH METALLIZATION ON BOTH SIDES

(71) Applicant: INTEL CORPORATION, Santa Clara, CA (US)

(72) Inventors: Glenn A. Glass, Portland, OR (US); Anand S. Murthy, Portland, OR (US); Karthik Jambunathan, Hillsboro, OR (US); Chandra S. Mohapatra, Hillsboro, OR (US); Mauro J. Kobrinsky, Portland, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/306,295

(22) PCT Filed: Jul. 1, 2016

(86) PCT No.: PCT/US2016/040688
§ 371 (c)(1),
(2) Date: Nov. 30, 2018

(87) PCT Pub. No.: WO2018/004653
PCT Pub. Date: Jan. 4, 2018

(65) Prior Publication Data
US 2019/0157310 A1    May 23, 2019

(51) Int. Cl.
*H01L 27/12* (2006.01)
*H01L 27/088* (2006.01)
(Continued)

(52) U.S. Cl.
CPC .. *H01L 27/1211* (2013.01); *H01L 21/823431* (2013.01); *H01L 21/823475* (2013.01);
(Continued)

(58) Field of Classification Search
CPC ............ H01L 27/1203; H01L 27/1211; H01L 27/0886; H01L 29/41725; H01L 29/4175
See application file for complete search history.

(56) References Cited

U.S. PATENT DOCUMENTS 5,316,977 A * 5/1994 Kunishima ....... H01L 21/28518
148/DIG. 147
5,869,867 A    2/1999 Takeuchi
(Continued)

FOREIGN PATENT DOCUMENTS

WO    2018004653 A1    1/2018

OTHER PUBLICATIONS

International Search Report and Written Opinion received for PCT Application No. PCT/US2016/040688. dated Apr. 28, 2017. 14 pages.
(Continued)

*Primary Examiner* — Matthew E Warren
(74) *Attorney, Agent, or Firm* — Finch & Maloney PLLC

(57) ABSTRACT

Techniques are disclosed for backside contact resistance reduction for semiconductor devices with metallization on both sides (MOBS). In some embodiments, the techniques described herein provide methods to recover low contact resistance that would otherwise be present with making backside contacts, thereby reducing or eliminating parasitic external resistance that degrades transistor performance. In some embodiments, the techniques include adding an epitaxial deposition of very highly doped crystalline semiconductor material in backside contact trenches to provide enhanced ohmic contact properties. In some cases, a back- (Continued)

side source/drain (S/D) etch-stop layer may be formed below the replacement S/D regions of the one or more transistors formed on the transfer wafer (during frontside processing), such that when backside contact trenches are being formed, the backside S/D etch-stop layer may help stop the backside contact etch process before consuming a portion or all of the S/D material. Other embodiments may be described and/or disclosed.

20 Claims, 22 Drawing Sheets

(51) Int. Cl.
  *H01L 29/417* (2006.01)
  *H01L 29/775* (2006.01)
  *H01L 21/8234* (2006.01)
  *H01L 21/84* (2006.01)
  *H01L 21/8238* (2006.01)
  *H01L 29/78* (2006.01)
  *H01L 29/06* (2006.01)

(52) U.S. Cl.
  CPC .... *H01L 21/823871* (2013.01); *H01L 21/845* (2013.01); *H01L 27/0886* (2013.01); *H01L 27/1203* (2013.01); *H01L 29/4175* (2013.01); *H01L 29/41725* (2013.01); *H01L 29/775* (2013.01); *H01L 29/78* (2013.01); *H01L 29/0673* (2013.01)

(56) References Cited

U.S. PATENT DOCUMENTS

| | | |
|---|---|---|
| 8,841,189 B1 | 9/2014 | Cheng et al. |
| 2003/0119279 A1 | 6/2003 | Enquist |
| 2006/0043485 A1 | 3/2006 | Fukushima et al. |
| 2011/0241073 A1 | 10/2011 | Cohen et al. |
| 2011/0278678 A1* | 11/2011 | Fukushima ......... H01L 27/1229 257/369 |
| 2013/0234203 A1* | 9/2013 | Tsai ................. H01L 29/66795 257/190 |
| 2013/0248999 A1 | 9/2013 | Glass et al. |
| 2014/0367753 A1 | 12/2014 | Huang et al. |
| 2015/0060967 A1* | 3/2015 | Yokoyama .......... H01L 27/1463 257/292 |
| 2015/0137307 A1 | 5/2015 | Stuber |
| 2015/0187881 A1 | 7/2015 | Basker et al. |
| 2015/0206942 A1 | 7/2015 | Glass et al. |
| 2015/0311204 A1 | 10/2015 | Glass et al. |
| 2016/0322479 A1* | 11/2016 | Liu .................. H01L 29/66977 |

OTHER PUBLICATIONS

International Preliminary Report on Patentability received for PCT Application No. PCT/US2016/040688. dated Jan. 10, 2019. 11 pages.

Extended European Search Report received for EP Application No. 16907603.1, dated Feb. 5, 2020. 10 pages.

* cited by examiner

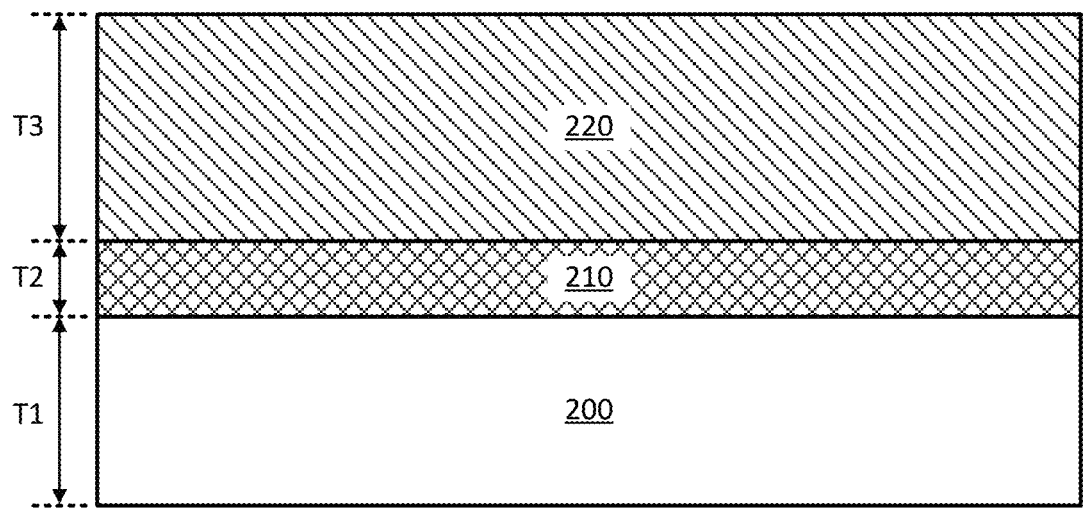
FIG. 2A
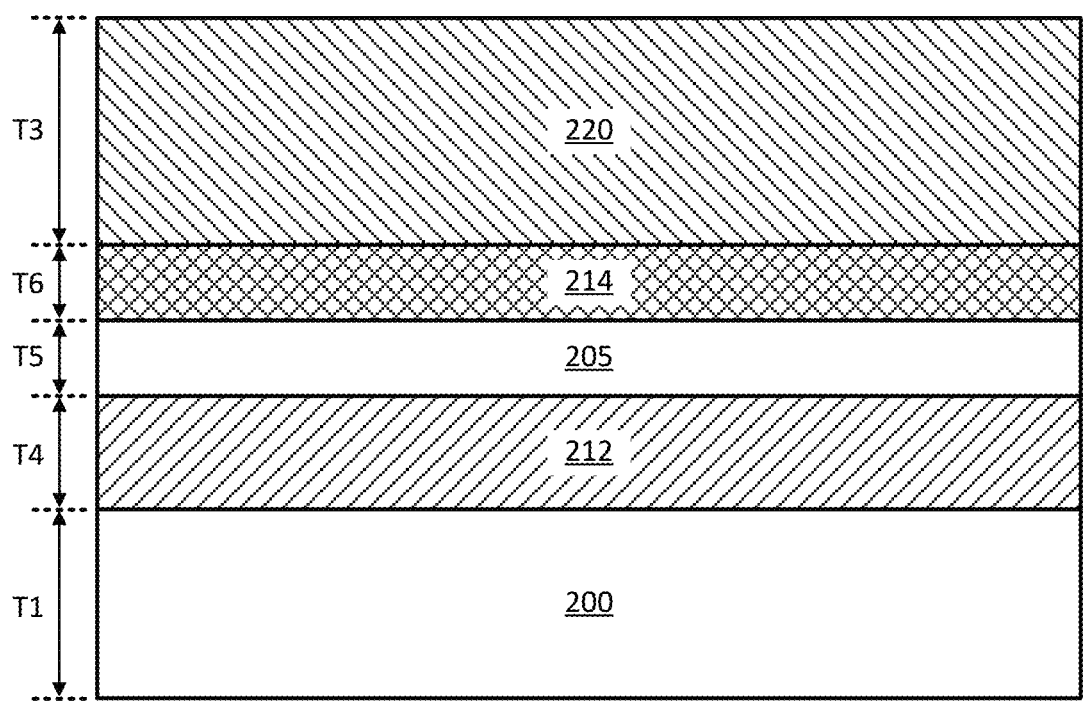
FIG. 2A'
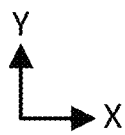

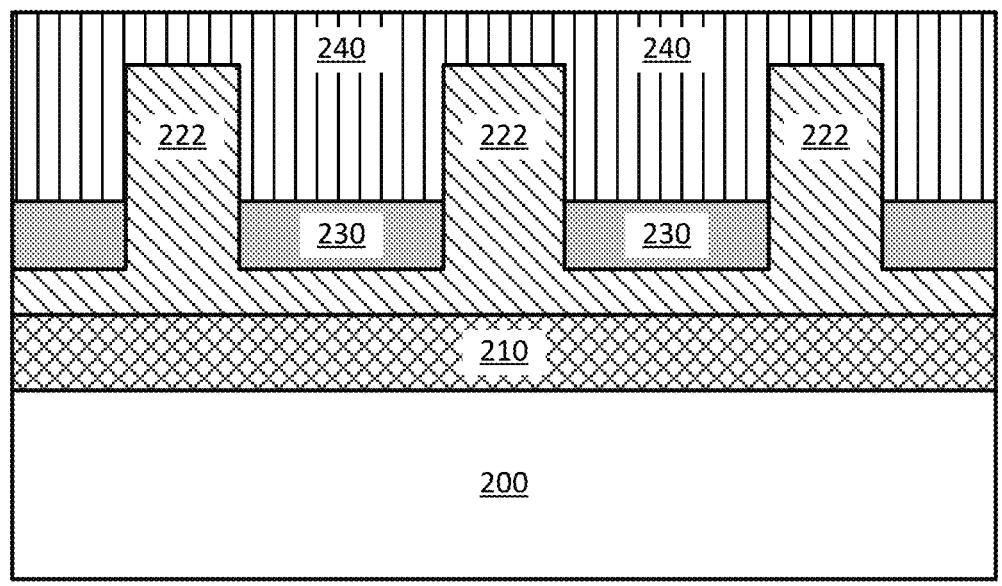
FIG. 2B
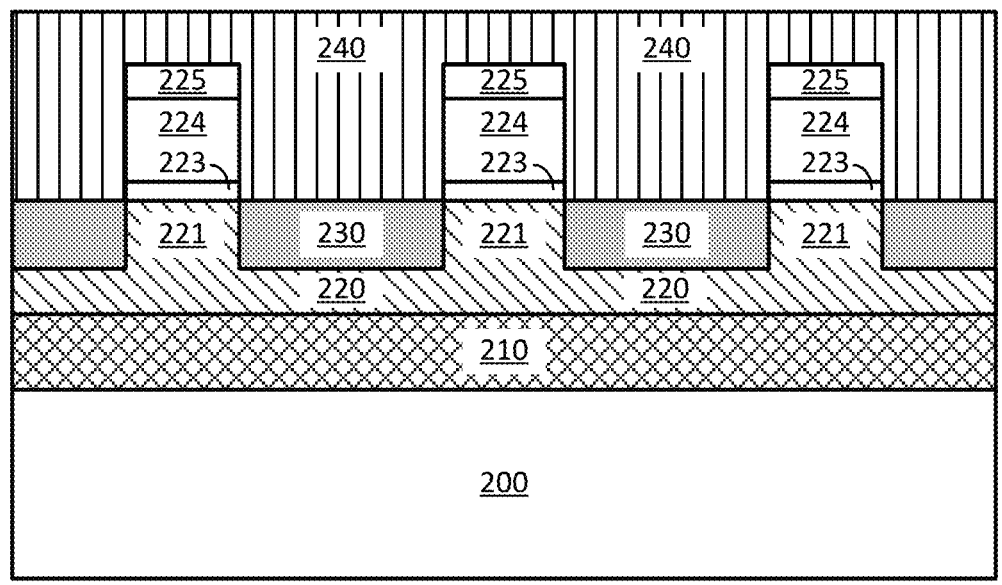
FIG. 2C
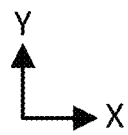

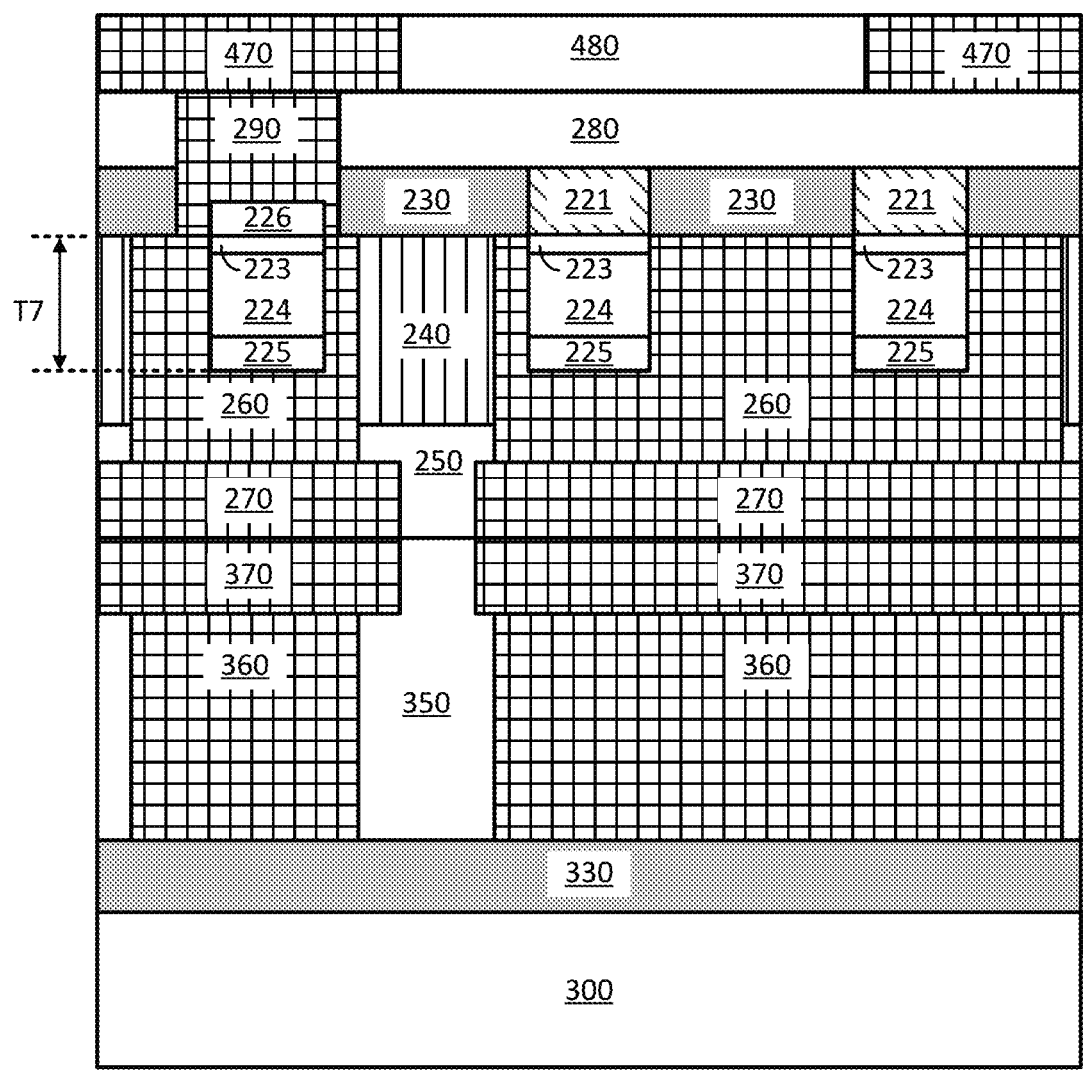
FIG. 6
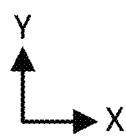

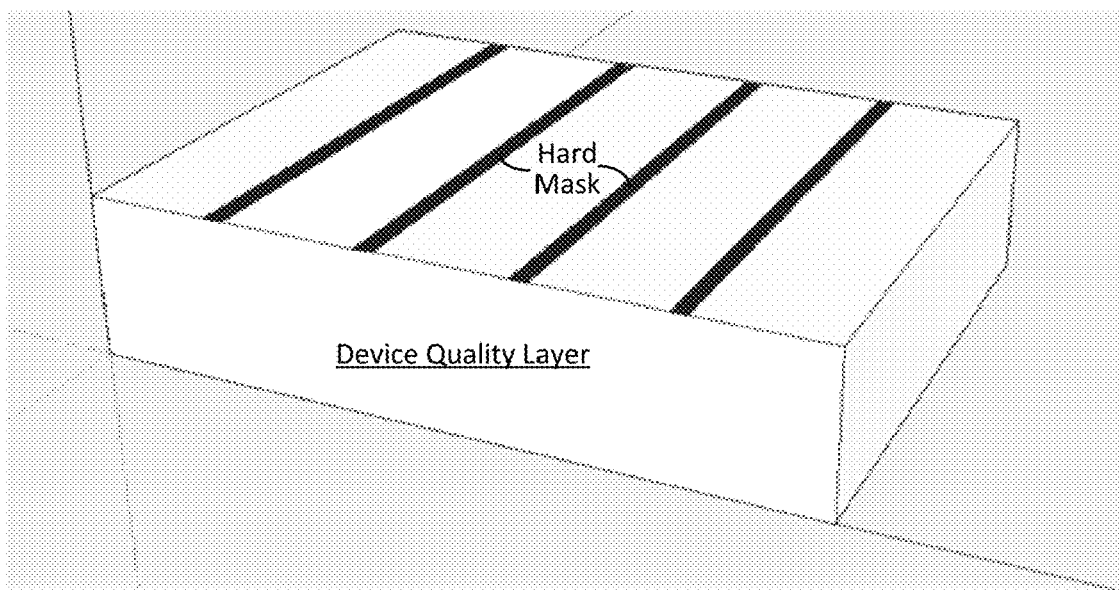
FIG. 7A
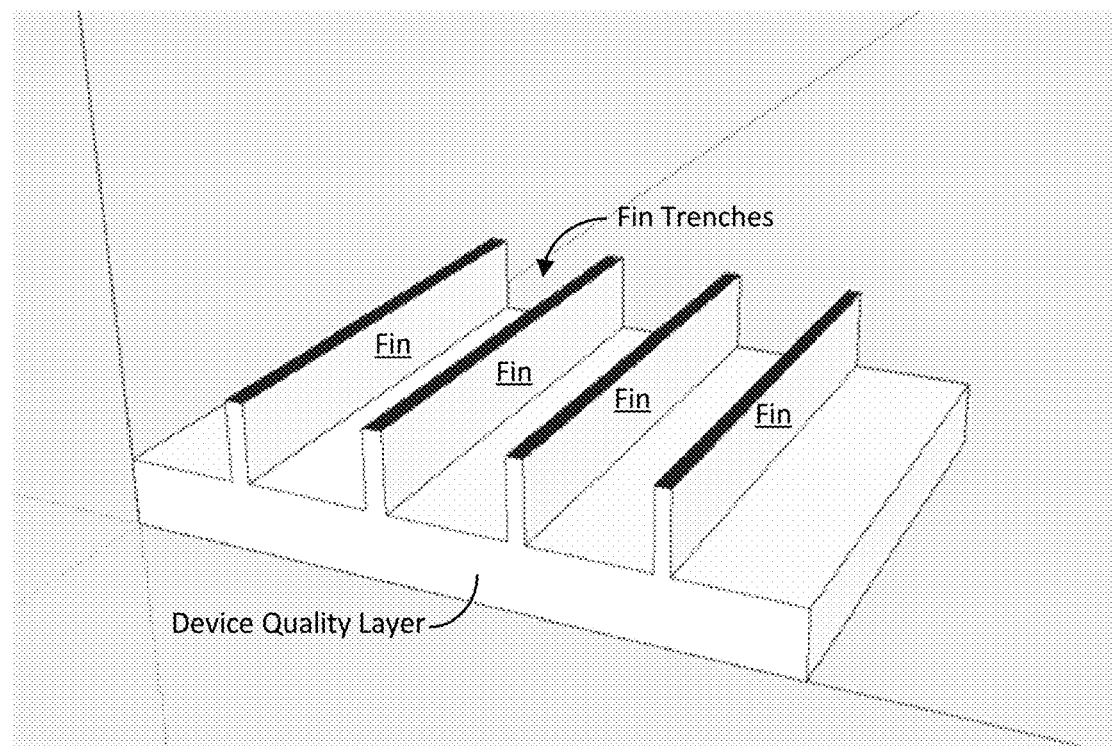
FIG. 7B
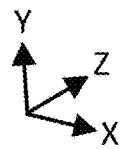

BACKSIDE CONTACT RESISTANCE REDUCTION FOR SEMICONDUCTOR DEVICES WITH METALLIZATION ON BOTH SIDES

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called, the body or substrate, which can be used to bias the transistor. In addition, metal-oxide-semiconductor FETs (MOSFETs) include a gate dielectric layer between the gate and the channel. A FinFET is a MOSET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around or nanoribbon transistor) is configured similarly to a fin-based transistor, but instead of a finned channel region where the gate is on three portions (and thus, there are three effective gates), one or more nanowires are used and the gate material generally surrounds each nanowire.

Integrated circuit (IC) fabrication primarily includes two portions: the front-end or front-end-of-line (FEOL) and the back-end or back-end-of-line (BEOL). The front-end or FEOL is the first portion of IC fabrication where individual semiconductor devices are formed, including all processes up to the deposition of metal interconnect layers. The back-end or BEOL, not to be confused with back-end chip fabrication, is the second portion of IC fabrication where the individual semiconductor devices get interconnected with metal wiring. BEOL may include any number of metallization layers, depending on the target application or end use.

BRIEF DESCRIPTION OF THE DRAWINGS

FIGS. 2A-D illustrate forming at least one transistor on a multilayer substrate including a bulk wafer, a sacrificial layer, and a device-quality layer, in accordance with some embodiments of the present disclosure. Note that FIG. 2A' illustrates another example multilayer substrate, in accordance with an embodiment of the present disclosure.

FIG. 6 illustrates an example structure after backside back-end processing is performed on the structure of FIG. 5B, in accordance with an embodiment of the present disclosure.

FIGS. 7A-M illustrate perspective views of example IC structures formed when carrying out the method of FIG. 1, in accordance with some embodiments of the present disclosure.

Figure 1:
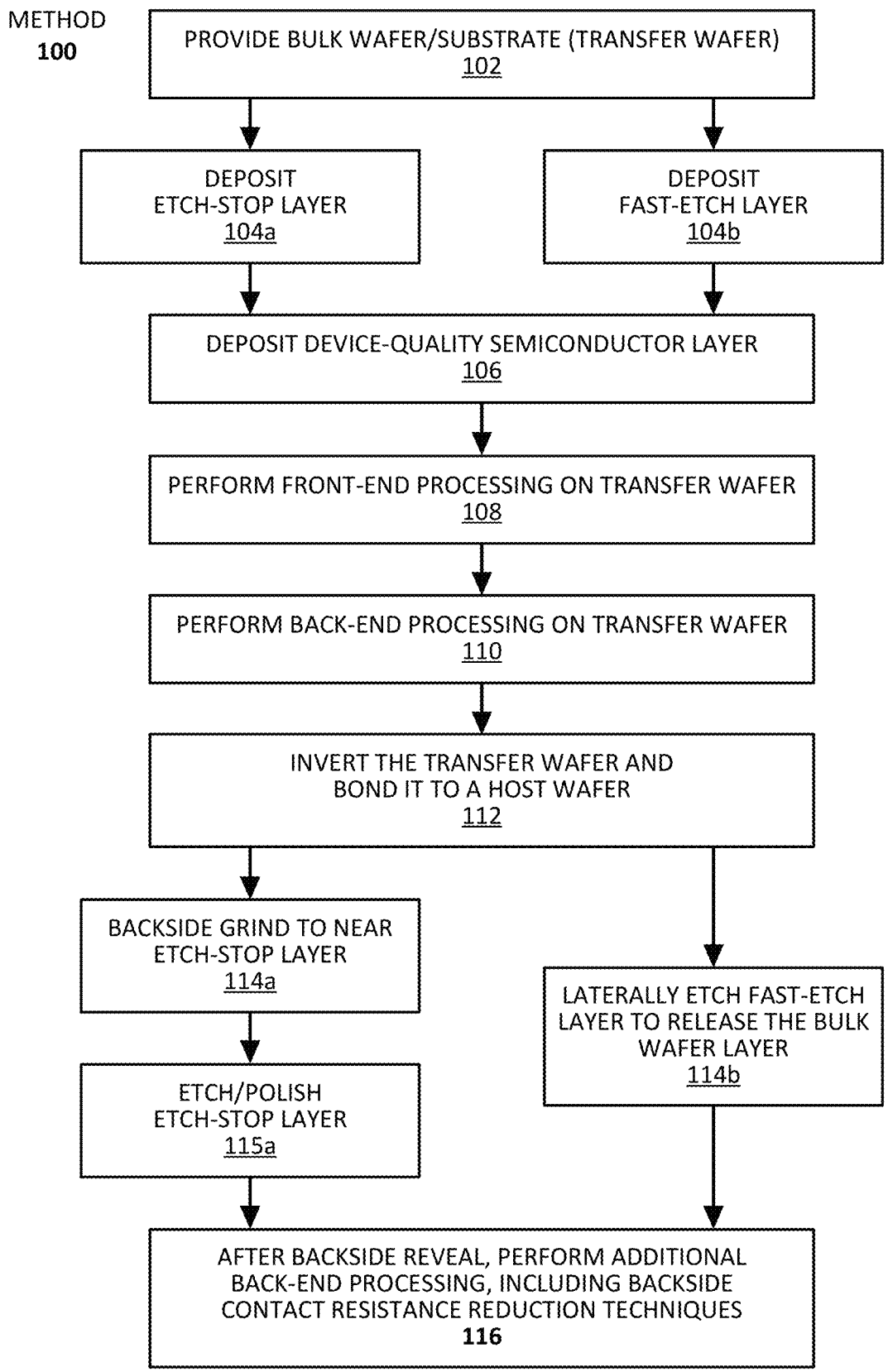
FIG. 1 illustrates a method of forming an integrated circuit (IC) including a metallization on both sides (MOBS) scheme and including backside contact resistance reduction, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Metallization on both sides (MOBS) is a concept in integrated circuit (IC) fabrication where front-end or FEOL IC processing is done per state of the art (albeit, with some of the contacts potentially processed very deep), followed by a back-end or BEOL IC process flow. The wafer, referred to as a transfer wafer, is then flipped and bonded to a new support wafer, which is referred to as a host wafer. The backside of the transfer wafer can then be removed via some combination of grind, etch, and/or chemical mechanical polishing/planarization (CMP), with or without the use of an etch stop layer (e.g., a crystalline or amorphous insulator like silicon on insulator (SOI), for example). Such a substrate removal process is referred to as a backside reveal, as it reveals the backside or underside of the device layer, which may include one or more semiconductor devices (e.g., transistors), formed during front-end processing on the transfer wafer, thereby allowing subsequent processing to be performed from the backside. The subsequent processing can include forming additional contact trenches in the revealed backside and then depositing metal contacts the contact trenches. Additional processing may include one or more additional layers of back-end processing (e.g., forming one or more additional metallization layers), and followed additionally by backside-back-end (BBE) processing (e.g., including solder bumps). However, in such a MOBS construct, making contact to the bottom or backside of the source and drain regions, for example, makes for a relatively poor ohmic contact, thereby degrading performance.

Thus, and in accordance with one or more embodiments of the present disclosure, techniques are disclosed for backside contact resistance reduction for semiconductor devices with metallization on both sides (MOBS). In some embodiments, the techniques described herein can be used to provide low contact resistance that would otherwise not be present with making backside contacts, thereby reducing or eliminating parasitic external resistance that degrades transistor performance. In some embodiments, the techniques include adding an epitaxial deposition of highly doped crystalline semiconductor material in backside contact trenches to provide enhanced ohmic contact properties. To assist with the backside contact resistance reduction techniques, in some embodiments, a backside source/drain (S/D) etch-stop layer may be formed below the S/D regions of the one or more transistors formed on the transfer wafer (during device layer fabrication of front-end processing). Thus, when backside contact trenches are subsequently formed after the backside reveal process, the backside S/D etch-stop layer can be used to stop the backside contact etch process before consuming a portion or all of the S/D material. In some embodiments, use of such a MOBS scheme can reduce the number of metallization layers needed in the final structure, such as a reduction of 2-6 metallization layers, depending on the application and configuration. Such a reduction of required metallization layers results in significant cost savings. Additional transistor performance improvements include reduced parasitic capacitance in metal lines as well as improved die-yield due to reduced occurrence of electromigration based open-circuit failures compared to a typical (i.e., single-sided) process flow. Numerous benefits of the MOBS scheme and backside contact resistance reduction techniques will be apparent in light of this disclosure.

As previously described, in some embodiments, the backside contact resistance reduction techniques provided herein are implemented within the context of a MOBS scheme. In some such embodiments, the MOBS scheme may be achieved by forming a multilayered substrate including a bulk wafer (e.g., a bulk silicon or silicon on insulator (SOI) wafer), an etch-stop and/or fast-etch layer deposited on the wafer, and a device-quality layer deposited on the etch-stop or fast-etch layer. Standard front-end processing can then be performed on the multilayered substrate to form as many semiconductor devices (e.g., transistors) as desired in the device-quality layer to create a device layer. Standard back-end processing can then be performed over that device layer to form contacts and as many metal (or otherwise electrically conductive) back-end layers as desired. In some embodiments, frontside vias or contacts may be processed very deep, such as into at least a portion of the multilayered substrate below the device layer, as the deeply processed vias may be used for making contact through the device layer from the backside, for example. The resulting fully integrated wafer, referred to herein as a transfer wafer, can then be bonded to another wafer, referred to herein as a host wafer, that includes may include one or more metallization layers and may also optionally be fully integrated with one or more transistor devices, for example. The bonding may occur by turning the transfer wafer upside down to invert it and then connecting the metal back-end and/or insulator material (e.g., oxide material) of the transfer wafer to the metal back-end and/or insulator material on the host wafer, such that the blank or otherwise unpopulated sides of the two sandwiched wafers are facing outward. Such bonding can be performed using heat, pressure, and/or force, in presence of a controlled environment such as a forming gas or ammonia, for example. In some embodiments, the host wafer may be a mechanical support and have no active electronic function, as it may be removed in a final product. Accordingly, the host wafer may include a non-semiconductor material, such as silicon oxide or silicon nitride or other refractory (e.g., alumina or yittria), to provide a few examples. In another embodiment, the host wafer may be a graphite disc with silicon carbide coating for resistance to chemical attack, for example.

After the transfer wafer is bonded to the host wafer, the bulk wafer portion of the transfer wafer (e.g., the majority of the multilayer substrate thickness that is not populated with active device elements) can be removed from the multilayer substrate (backside reveal process). In embodiments including an etch-stop layer in the multilayer substrate, a backside grind can be performed to get close to the etch-stop layer and then a wet etch and/or polish process can be performed until the etch/polish is effectively stopped at the etch-stop layer. In some such embodiments, only the device layer (including transistors formed thereon/therefrom) and possibly some of the etch-stop layer will remain on the transfer wafer, thereby enabling a vertical integration scheme. In other embodiments including a fast-etch layer in the multilayer substrate, a lateral wet etch can be performed to remove the fast-etch layer and allow for the release (liftoff process, rather than a grind process) of the bulk wafer from the device-quality layer. In some such embodiments, only the device layer (including transistors formed thereon/therefrom) and possibly some of the fast-etch layer will remain on the host wafer, significantly reducing the thickness of the transfer wafer, thereby enabling vertical integration schemes. In still other embodiments, the multilayer substrate may include both a fast-etch and an etch-stop layer, as will be apparent in light of this disclosure. In some such embodiments, the lateral etch can be performed to release the bulk wafer and then a backside etch and/or polish can be performed until the etch/polish is effectively stopped at the etch-stop layer.

Note that "device-quality" and "device layer" as used herein (e.g., device-quality layer or device-quality material) denotes high-quality single-crystal semiconductor material. The high-quality component may be representative of defect levels (e.g., less than 1E8 defects per square cm), contamination levels, dopant levels, roughness, and/or any other suitable or desired property of the material, as will be apparent in light of the present disclosure. The device quality layer may contain regions of graded or step-function concentration gradient to provide regions of either high or low etch and/or polish rates to facilitate the backside reveal process, as can be understood based on this disclosure. As will be further apparent, a MOBS scheme cannot be achieved without using the integration techniques variously described herein. This is because the device-quality material from which one or more transistors are formed on the transfer wafer needs to have a single-crystal structure of sufficiently high-quality from the standpoint of contamination, doping, defect, roughness, etc. Without having the crystal structure defined by a bulk wafer, such high-quality single-crystal material cannot be achieved and thus the device-quality layer for vertically integrated transistor levels would not be achievable. Therefore, the backside contact resistance reduction techniques described herein can first make use of the transfer-to-host-wafer integration techniques described herein, as will be apparent in light of this disclosure. Note that, after the transfer-to-host wafer integration scheme to form a MOBS structure, portions below the device layer (originally formed on the transfer wafer) may generally be referred to as the frontside of the device layer, while portions above the device layer may generally be referred to as the backside of the device layer. Further note that the frontside of the device layer may be subjected to both so-called front-end and back-end processing, as such processing can be performed prior to the transfer-to-host wafer bonding. After the transfer-to-host wafer integration and backside reveal has been performed, the backside may be subjected to what would be considered back-end processing, but as such back-end processing is being performed on the backside of the device layer, it may be referred to as so called backside-back-end (BBE) processing herein. Further note that frontside and backside are relative to a given orientation of the device layer, which changes during the transfer-to-host wafer integration scheme, as the device layer is inverted.

As will also be apparent in light of this disclosure, the integration techniques can be used with various different configurations, including numerous transistor geometries and material schemes. For instance, device-quality layer material may include various semiconductor materials, such as group IV semiconductor materials (e.g., silicon (Si), germanium (Ge), SiGe), group III-V semiconductor materials (e.g., gallium arsenide (GaAs), indium gallium arsenide (InGaAs), indium gallium antimonide (InGaSb), indium phosphide (InP)), graphene, molybdenum disulfide ($MoS_2$), carbon nanotubes, or any other material that forms a three dimensional or a two dimensional crystal capable of forming a transistor. In embodiments where the device-quality layer includes Si, for instance, an example etch-stop material includes carbon (C) doped Si (Si:C) with C doping content in the range of 1-30% and example fast-etch materials include SiGe and boron (B) doped SiGe (SiGe:B). In embodiments where the device-quality layer includes Ge or SiGe with greater than 80% Ge content, example etch-stop materials include Ge or Ge:C with C doping content in the range of 1-30% and example fast-etch materials include germanium tin (GeSn) and GeSn:B. In embodiments where the device-quality layer includes SiGe alloy with Ge content in the range of 10-80%, an example etch-stop material is SiGe:C with C doping content in the range of 1-30% and an example fast-etch material is SiGe with approximately 10% or more higher Ge content than the SiGe device-quality layer (which may be boron doped). In embodiments where the device-quality layer includes InGaAs, an example etch-stop material includes indium phosphate (InP) and an example fast-etch material includes gallium arsenide (GaAs). In some cases, practical limitations may exist on the combinations of materials and fast/slow etch layers in terms of sustainability to maintain high-quality single-crystal device quality over-layers, as will be apparent in light of the present disclosure.

Numerous benefits of the transfer-to-host-wafer integration techniques variously described herein will be apparent in light of this disclosure. For example, the techniques can be used to cleanly produce a transistor and back-end stack on a very thin device-quality substrate, such as a substrate having a thickness of less than 500, 250, 100, or 50 nm, or some other suitable maximum thickness, depending on the end use or target application. As previously described, such a thin substrate would have to be of device level quality for integration purposes in areas such as contamination, doping levels, defect levels (e.g., point, line, and bulk defect levels), roughness, and wafer bow, just to name a few example areas. Use of the etch-stop and/or fast-etch layers in the integration techniques as described herein provides built-in self-alignment capabilities such that every wafer can be made to the desired specifications, including the ability to achieve device level quality substrates and enable vertical scaling (e.g., for multiple layers of front-end devices, if so desired). In addition, the transfer-to-host-wafer integration techniques variously described herein provide benefits over mere grinding and etching techniques, as such techniques do not include a built-in etch stop layer or fast etch layer, resulting in thickness uniformity problems that can affect performance and reliability. The integration techniques described herein demonstrate control over the thickness of the substrate of the stacked layer and also allow for very thin device-quality layers to be vertically stacked. In addition, the integration techniques described herein enable a MOBS scheme, including the backside contact resistance reduction techniques described herein. Such backside contact resistance reduction techniques can provide improved or enhance ohmic contact properties, as will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an IC MOBS structure including a backside contact resistance reducing layer for the source/drain (S/D) regions of a transistor. For example, in some such embodiments, the transistor (or plurality of transistors) may be first formed on a transfer wafer that includes at least one metallization layer. The transfer wafer can then be inverted and bonded to a host wafer, such that the at least one metallization layer is between the substrate of the host wafer and the transistor layer. Then, a backside reveal can be performed using any combination of grinding, etching, and/or CMP processing to gain access to the backside of S/D regions of the transistor(s), such as via backside contact trenches. In the backside contact trenches, a backside contact resistance reduction layer may be formed to improve or enhance ohmic contact properties for the S/D regions. Numerous configurations and variations will be apparent in light of this disclosure.

Architecture and Methodology

FIG. 1 illustrates a method 100 of forming an integrated circuit (IC) including a metallization on both sides (MOBS) scheme and including backside contact resistance reduction, in accordance with some embodiments of the present disclosure. As will be apparent in light of this disclosure, the backside contact resistance reduction can be achieved, in some embodiments, via the formation of a contact resistance reduction layer on the backside of the source/drain regions of one or more transistors of the IC, for example. FIGS. 2A-D, 3, 4-4', and 5A-B illustrate example integrated circuit structures that are formed when carrying out the method 100 of FIG. 1, in accordance with some embodiments. As will be apparent in light of the structures formed, method 100 discloses techniques for vertical semiconductor device integration, which will be demonstrated with transistor devices. The structures are primarily depicted using transistor devices including a finned configuration (e.g., FinFET or tri-gate) for ease of illustration. However, the techniques can be used to integrate transistors of any suitable geometry, depending on the end use or target application. Various example transistor device geometries that can benefit from the integration and backside contact resistance reduction techniques described herein include, but are not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), and nanowire (or nanoribbon or gate-all-around) transistor configurations. In addition, the techniques may be used to vertically integrate p-type transistor devices (e.g., p-MOS or p-TFET) and/or n-type transistor devices (e.g., n-MOS or n-TFET). Further, the techniques may be used to vertically integrate complementary transistor-based devices, such as complementary MOS (CMOS) or complementary TFET (CTFET) devices, or few to single electron quantum transistor devices, for example. Further still, such devices may employ semiconductor materials that are three dimensional crystals as well as two dimensional crystals or nanotubes, for example. In some embodiments, the techniques may be used to benefit devices of varying scales, such as IC devices having critical dimensions in the micrometer range and/or in the nanometer range (e.g., formed at the 32, 22, 14, 10, 7, or 5 nm process nodes, or beyond).

As can be seen in FIG. 1, method 100 includes providing 102 a bulk wafer or substrate, depositing 104a an etch-stop layer or depositing 104b a fast-etch layer, and depositing a device-quality semiconductor layer 106 to form an example multilayer substrate illustrated in FIG. 2A, in accordance with an embodiment. The multilayer substrate, in this example embodiment, includes bulk wafer layer 200, etch-stop or fast-etch layer 210 and device-quality semiconductor layer 220. In some embodiments, bulk wafer layer 200 may be: a bulk substrate including a group IV material, such as silicon (Si), germanium (Ge), silicon germanium (SiGe), or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium arsenide (GaAs), gallium nitride (GaN), indium gallium arsenide (InGaAs), indium gallium nitride (InGaN), aluminum gallium arsenide (AlGaAs), aluminum gallium nitride (AlGaN), and indium phosphide (InP), to name some examples. In some embodiments, bulk wafer 200 may be doped with one or more materials, such as including p-type or n-type impurity doping of any suitable concentration, for example. In some embodiments, bulk wafer 200 may include a surface crystalline orientation described by a Miller Index of <100>, <110>, or <111>, or its equivalents, as will be apparent in light of this disclosure. As the devices formed on bulk wafer 200 are to be integrated to another host wafer, bulk wafer 200 may be referred to herein as a transfer wafer, for ease of reference. In addition, for ease of description, the present disclosure will be described primarily in the context of bulk wafer 200 being a bulk Si or SOI wafer. In some cases, the thickness T1 of bulk wafer layer 200 may be, for example, 0.1-2 mm, such as 0.75 mm for 8 inch diameter wafers, as is standard. However, the thickness T1 of bulk wafer layer 200 may be any suitable thickness, as will be apparent in light of this disclosure.

In this example embodiment, layer 210 may either be an etch-stop layer or a fast-etch layer that has been deposited 104a or 104b on the bulk wafer layer 200. As will be apparent in light of the present disclosure, layer 210 is a sacrificial layer that assists with the removal of bulk wafer layer 200. Accordingly, as is described in more detail herein, sacrificial layer 210 is either completely or partially removed during performance of the integration techniques. Deposition 104a or 104b may include a blanket deposition of sacrificial layer 210 or a selective growth of sacrificial layer 210 on layer 200 using chemical vapor deposition (CVD), atomic layer deposition (ALD), molecular beam epitaxy (MBE), and/or any other suitable process, depending on the end use or target application. In some embodiments, the top surface of wafer layer 200 may be treated (e.g., chemical treatment, thermal treatment, etc.) prior to deposition of sacrificial layer 210. In some embodiments, where sacrificial layer 210 is an etch-stop layer, the thickness T2 of the etch-stop layer 210 may be in the range of 50-200 nm, for example, or any suitable thickness that allows etch/polish 115a hitting the valleys caused by backside grind 114a to withstand the etch/polish 115a process until all peaks (made as a result of the backside grind) are consumed, as will be described in more detail with reference to FIG. 5A. In some embodiments, where sacrificial layer 210 is a fast-etch layer, the thickness T2 of the fast-etch layer 210 may be at least 500 nm, for example, or any suitable thickness that allows lateral etch 114b to etch in from the edges of the wafer and allow a liftoff or removal of the wafer, as will be described in more detail with reference to FIG. 5B. However, the thickness T2 of sacrificial layer 210 may be any suitable thickness, as will be apparent in light of this disclosure.

In this example embodiment, device-quality layer 220 includes Si, Ge, SiGe, III-V material, graphene, $MoS_2$, and/or carbon nanotubes. In some embodiments, layer 220 may include a plurality of multilayer materials, which may be used for nanowire transistor configuration applications, for example. In addition, layer 220 may be doped with one or more other materials (e.g., with suitable n-type and/or p-type dopants), depending on the end use or target application. Deposition 106 of layer 220 can be performed using any deposition process described herein (e.g., CVD, ALD, MBE, etc.) or any other suitable deposition process. In some embodiments, the thickness T3 of device-quality layer 220 may be in the range of 300-500 nm, for example, or any other suitable thickness as will be apparent in light of this disclosure. As can be understood based on this disclosure, one or more transistor devices will be formed using device-quality layer 220, and those devices will be bonded to a host wafer to allow for a MOBS scheme, as will be described in more detail herein.

Any suitable material may be used for sacrificial layer 210, depending on the selected configuration. In some embodiments, the material selected for sacrificial layer 210 may be based on whether layer 210 is an etch-stop layer or a fast-etch layer, the material of bulk wafer layer 200, and/or the material of device-quality layer 220. For instance, in the case of a Si bulk wafer 200 and an Si device-quality layer 220, an example etch-stop material includes Si:C with C doping content in the range of 1-30% and example fast-etch materials include SiGe and SiGe:B. In the case of a Si bulk wafer 200 and a Ge or SiGe with greater than 80% Ge content device-quality layer 220, for layer 210, example etch-stop materials include Ge or Ge:C with C doping content in the range of 1-30% and example fast-etch materials include GeSn and GeSn:B. In the case of a Si bulk wafer 200 and a SiGe with Ge content in the range of 10-80% device-quality layer 220, for layer 210, an example etch-stop material includes SiGe:C with C doping content in the range of 1-30% and an example fast-etch material includes SiGe with approximately 10% or more higher Ge content than the SiGe device-quality layer (which may or may not be boron doped). In the case of a Si bulk wafer 200 and an InGaAs device-quality layer 220, for layer 210, an example etch-stop material includes InP and an example fast-etch material includes GaAs. In embodiments including a fast-etch layer, the fast-etch material may be selected based on the ability to remove that fast-etch material at a rate of at least 2, 5, 10, 20, 50, 100, or 200 times faster than the material of one or more of the surrounding layers. Numerous variations on the materials of sacrificial layer 210, whether the layer is an etch-stop layer or a fast-etch layer, will be apparent in light of the present disclosure.

FIG. 2A' illustrates another example multilayer substrate, in accordance with an embodiment. In this example embodiment, bulk wafer 200 and device-quality layer 220 are the same as described with reference to the example structure of FIG. 2A, but additional layers are included between them. As can be seen in method 100 of FIG. 1, some embodiments include both an etch-stop layer and a fast-etch layer, which is the case in the example structure of FIG. 2A', where layer 212 is a fast-etch layer and layer 214 is an etch-stop layer. The previous relevant discussion with respect to layer 210 is equally applicable to this structure. For example, the relevant thicknesses and materials discussed with reference to layer 210 as a fast-etch layer apply to fast-etch layer 212 (having a thickness T4). Further, the relevant thicknesses and materials discussed with reference to layer 210 as an etch-stop layer apply to etch-stop layer 214 (having a thickness T6). As can also be seen in FIG. 2A', layer 205 is sandwiched between fast-etch layer 212 and etch-stop layer 214. Layer 205 may be included as a transitional layer that assists with the etch and removal of layer 212 and/or assists with the etch/polish performed to etch-stop layer 214, as will be apparent in light of the present disclosure. In some embodiments, layer 205 may include the same material as bulk wafer 200 or layer 205 may include the same material of layer 220, for example. Further, in some embodiments, layer 205 may have a thickness T5 in the range of 50-300 nm, for example, or any other suitable thickness depending on the end use or target application. Note that the deposition of any of layers 212, 205, 214, and 220 can be performed using any deposition process described herein (e.g., CVD, ALD, MBE, etc.) or any other suitable deposition process.

Method 100 of FIG. 1 continues with performing 108 front-end processing using the example multilayer substrate of FIG. 2A to form the resulting example structure shown in FIG. 2B, in accordance with an embodiment. As can be seen in FIG. 2B, after front-end processing 108, the device-quality layer 220 was formed into fins 222, shallow trench isolation (STI) material 230 was deposited and recessed, and gate 240 was formed on fins 222 to define channel regions (where source/drain (S/D) regions are adjacent to the channel regions). The formation of fins 222 may have been performed using any suitable processes, such as a wet or dry etch process. Fins 222 may be formed to have varying widths and heights. For example, the height (dimension in the Y direction) to width (dimension in the X direction) ratio (h/w) of the fins may be greater than 1, such as 1.5 to 3, in some instances. Note that fins 222 and the trenches formed between the fins 222 are shown as having the same width and depth/height in this example structure for ease of illustration; however, the present disclosure is not intended to be so limited. Also note that although three fins 222 are shown in the example structure, any number of fins may be formed, such as one, two, ten, hundreds, thousands, millions, etc., depending on the end use or target application. Further note that although a portion of the device-quality layer 220 was formed into fins 222, the maximum thickness of the layer is still the same as (or approximately the same as) the original thickness of the deposited layer 220 shown in FIG. 2A (where the thickness may be measured from the bottom of layer 220 to the top of fins 222).

In the example structure of FIG. 2B, STI material 230 is present between fins 222 formed from device-quality layer 220. In some embodiments, deposition of the STI material 230 may include any deposition process described herein (e.g., CVD, ALD, MBE, etc.), or any other suitable deposition process. STI material 230 may include any suitable insulating material, such as one or more dielectric, oxide (e.g., silicon dioxide), or nitride (e.g., silicon nitride) materials. In some embodiments, the STI material 230 may selected based on the material of fins 222. For example, in the case of a Si device-quality layer 220, STI material 220 may be silicon dioxide or silicon nitride. As can also be seen in the structure of FIG. 2B, a gate 240 was formed on fins 222. In some embodiments, the formation of gate 240 may include a gate first flow (also called up-front hi-k gate). In some embodiments, the gate may be formed in a gate last flow (also called replacement metal gate (RMG)). In such gate last processing, the process includes dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors. Following opening the channel region, the dummy gate oxide and electrode may be replaced with, for example, a hi-k dielectric and a replacement metal gate, respectively.

In this example embodiment, the gate includes a gate electrode 240 and a gate dielectric (not shown for ease of illustration) formed directly under the gate electrode 240. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode 240 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Spacers may be formed adjacent to the gate and/or hardmask may be formed on the gate to, for example, assist with replacement gate processing and/or protect the gate during subsequent processing.

Front-end processing 108, in this example embodiment, continues with source/drain (S/D) processing, which includes removing at least a portion of fins 222 and replacing that portion with replacement material for the final S/D regions 224, to form the example resulting structure of FIG. 2C. As can be understood based on FIG. 2C, the S/D regions of fins 222 that was above the STI layer 230 were removed and replaced, in this example embodiment, to form replacement S/D regions 224 including optional backside etch-stop layer 223 and optional frontside contact resistance reduction layer 225. As a result, in the S/D region cross-section shown in FIG. 2C, only the sub-fin portion 221 of the original fins 222 formed remains. In some embodiments, replacement S/D regions 224 (which are replacement fins, in this example embodiment), may be formed with any suitable size and shape, such as a size and shape similar to the portion of the original fins 222 that exuded above STI material regions 230, for example. In some embodiments, any suitable techniques may be used to remove and replace the S/D regions, such as using masking, etching, and/or deposition processes, as can be understood based on this disclosure. In some embodiments, replacement S/D 224 may include any suitable material, such as any suitable semiconductor material (e.g., group IV or group III-V semiconductor material). Further, in some embodiments, the replacement S/D material 224 may or may not include any suitable n-type and/or p-type dopants, for example.

As shown in FIG. 2C, the S/D regions include optional backside etch-stop layer 223, in this example embodiment. As the backside contact resistance reduction techniques include forming backside contact trenches, it may be desired to control the depth of such backside contact trenches such that the etch process used does not remove (or minimally removes) the replacement S/D material 224, for example. Thus, in some embodiments, it may be desirable to first form backside etch-stop layer 223 prior to forming the main S/D region 224 material, for example. This may be achieved by forming the backside etch-stop layer to be a thin layer having a thickness (dimension in the Y direction) in the range of 0.5 to 10 nm (e.g., 1 to 5 nm), or any other suitable thickness or thickness range as will be apparent in light of this disclosure. In some embodiments, where present, the backside etch-stop layer 223 may include any suitable material, such as a carbon rich or carbon doped material, for example. For instance, in an example embodiment, where the S/D regions 224 include p-type doped group IV material, such as phosphorous doped silicon (Si:P), the backside etch-stop layer 223 may include phosphorous and carbon doped silicon (Si:P:C), with carbon dopant concentration being at least 1E17, 1E18, 1E19, or 1E20 atoms per cubic cm, or any other suitable content as will be apparent in light of this disclosure. In another example embodiment, where the S/D regions 224 include n-type doped group IV material, such as boron doped silicon germanium (SiGe), the backside etch-stop layer 223 may include boron and carbon doped silicon germanium (SiGe:B:C), with carbon dopant concentration being at least 1E17, 1E18, 1E19, or 1E20 atoms per cubic cm, or any other suitable content as will be apparent in light of this disclosure. In addition, the formation of the backside etch-stop layer 223 may be used as an initiation layer for p-type and/or n-type S/D material 224, as can be understood based on this disclosure. In some embodiments, the backside etch-stop layer 223 may be a distinct layer or it may be a portion of S/D region 224 that includes grading (e.g., increasing and/or decreasing) the content of one or more materials (e.g., carbon) when transitioning from layer 223 to region 224, for example. The backside contact trench etch used to make contact to the backside of an S/D region 224 may include etch selectivity of at least 2:1, 3:1, 4:1, 5:1, 10:1, 20:1, or 50:1 compared to the relative etch rate of the backside etch-stop layer 223 (e.g., which may be a carbon rich layer). As previously described, in some embodiments, backside etch-stop layer 223 need not be present, and thus the layer 223 is optional. For example, in the case of forming a III-V n-MOS transistor, the S/D material 224 may include a material (e.g., indium arsenide (InAs)) that provides a suitable relative etch selectivity rate for the backside contact trench etch (e.g., when using etchants such as ammonium hydroxide or potassium hydroxide for the final breakthrough to the S/D region material from the backside).

As is also shown in FIG. 2C, the S/D regions include optional frontside contact resistance reduction layer 225, in this example embodiment. In some embodiments, such a contact resistance reduction layer 225 may be formed on the frontside portion of the S/D regions to assist with ohmic contact, for example. In some embodiments, the frontside contact resistance reduction layer 225 may include any suitable material, such as group IV and/or group III-V material, or any other suitable material as will be apparent in light of this disclosure. In some embodiments, where frontside contact resistance reduction layer 225 is present, it may include degenerately doped material, such as including n-type and/or p-type dopant concentrations of at least 1E19, 1E20, 5E20, or 1E21 atoms per cubic cm, or some other suitable minimum threshold dopant concentration to assist with ohmic contact. In some embodiments, frontside contact resistance reduction layer 225 may include similar material as its respective S/D region 224. In some such embodiments, the material composition of the frontside contact resistance reduction layer or portion 225, relative to the S/D region(s) 224 for which the frontside contact resistance reduction layer or portion 225 is used, may be different than the material composition of that S/D region(s) 224. For instance, in the example case of a SiGe S/D region, a frontside contact resistance reduction layer or portion for that SiGe S/D region may also include SiGe, but with a relatively increased percentage of Ge in the SiGe material. Further, in the example case of an InGaAs S/D region, a frontside contact resistance reduction layer or portion for that InGaAs S/D region may also include InGaAs, but with a relatively increased percentage of In in the InGaAs material.

To provide more specific examples, for illustrative purposes, in an embodiment including an Si channel p-MOS having SiGe:B S/D regions with 3E20 B atoms per cubic cm, a frontside contact resistance reduction layer or portion for the S/D regions may include SiGe:B with 5E20 B atoms per cubic cm or Ge with 5E20 B atoms per cubic cm, for instance. In another example case, in an embodiment including an Si channel n-MOS having Si:P S/D regions with 5E20 P atoms per cubic cm, a frontside contact resistance reduction layer or portion for the S/D regions may include Si:P with 1E21 P atoms per cubic cm. Note that in some embodiments, frontside contact resistance reduction layer 225, where present, may be a distinct layer or may be a portion of the S/D regions 224 where one or more materials or material concentrations are graded (e.g., increased and/or decreased) from an S/D region 224 to the frontside contact resistance reduction portion 225, for example. For instance, when forming S/D regions 224, the final portion of the deposition process may include increasing the doping concentration in a steady or sudden manner. In some embodiments, frontside contact resistance reduction layer 225 may include a doping concentration (e.g., of any suitable n-type or p-type dopants) that is at least 1E17 to 1E21 atoms per cubic cm (e.g., at least 1E20 atoms per cubic cm) greater than the dopant concentration of the S/D regions 224 for which it is providing contact resistance reduction, or some other suitable relative amount as will be apparent in light of this disclosure.

Note that any additional or alternative suitable front-end processing 108 may be used and variations to the specific structure of FIG. 2C may be possible in other embodiments, as will be apparent in light of this disclosure. For example, in some embodiments, one or more of the fins 222 of the structure of FIG. 2B need not be removed and replaced by another semiconductor material, such that native fins are used in the end structure, for example. In another example embodiment, for transistor devices having a planar configuration, STI material 230 may not have been recessed to expose fins 222, resulting in the STI material 230 being level with the top of fins 222. Also note that front end-processing is also referred to as front-end-of-line (FEOL) and generally includes processes up to (but not including) the deposition of metal interconnect layers. As previously described, the front-end processing may include the formation of one or more transistor devices including any of the following: field-effect transistors (FETs), metal-oxide-semiconductor FETs (MOSFETs), tunnel-FETs (TFETs), planar configurations, dual-gate configurations, finned configurations (e.g., fin-FET, tri-gate), and/or nanowire (or nanoribbon or gate-all-around) configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). Numerous variations and configurations will be apparent in light of the present disclosure.

Figure 2D:
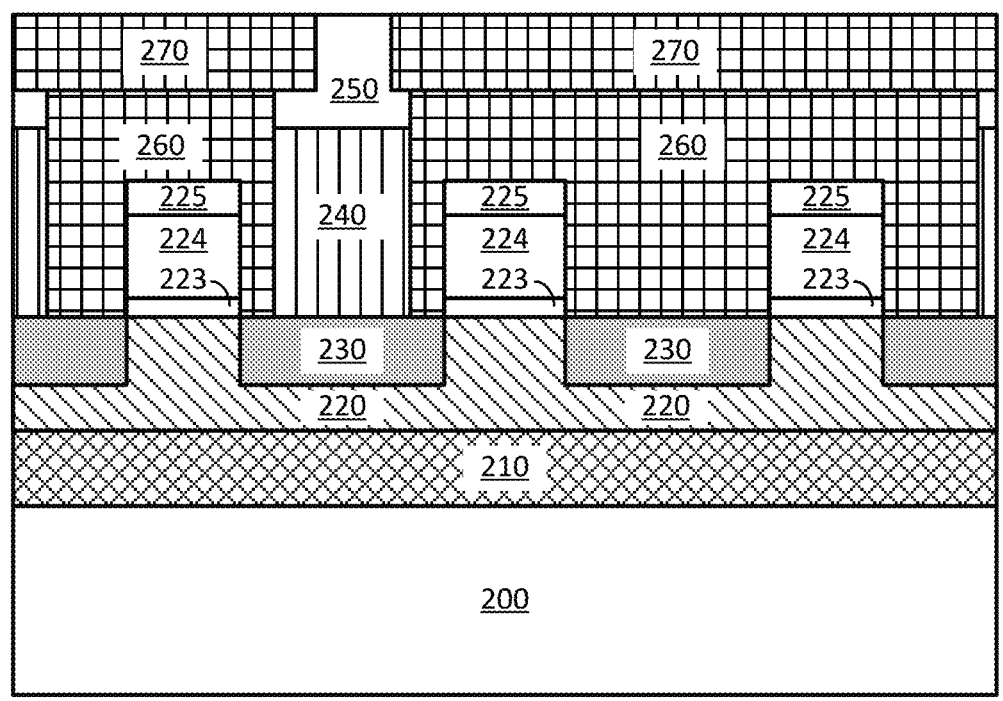

Method 100 of FIG. 1 continues with performing 110 back-end processing using the example structure of FIG. 2C to form the resulting example IC structure 20 (referred to herein as a transfer wafer) shown in FIG. 2D, in accordance with an embodiment. As can be understood based on this disclosure, such back-end processing 110 is still being performed on the frontside of the transfer wafer 20. The back-end processing 110 primarily includes the formation of one or more metal contacts 260, metal lines (and/or metal vias) 270, and insulator layers 250. Contacts 260 can be formed for the S/D regions and the gate using any suitable processes, such as forming contact trenches in insulator material over the respective regions and depositing metal or metal alloy or (or other suitable electrically conductive material) in the trenches. In some embodiments, contact formation may include silicidation, germinidation, or annealing processes, for example. The material of contacts 260 may include aluminum or tungsten, although any suitable conductive metal or alloy can be used, such as silver, nickel-platinum, or nickel-aluminum, for example. In some embodiments, contacts 260 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain contact regions, such as adhesion layers (e.g., titanium nitride) and/or liner or barrier layers (e.g., tantalum nitride), if so desired.

In this example embodiment, metallization line/layer 270 may be formed using any suitable processes and may be formed of any suitable material, such as copper or aluminum, for example. In this example embodiment, only one metal line/level 270 is shown for ease of illustration; however, any number of back end layers may be formed. Insulator 250 may be formed using any suitable processes and may be formed of any suitable material, such as a dielectric material, for example. In some embodiments, additional and/or alternative back-end processing may be performed, as will be apparent in light of this disclosure. Note that back-end processing is also referred to as back-end-of-line (BEOL) where individual devices (e.g., transistors, capacitors, resistors, etc.) get interconnected with wiring.

Figure 3:
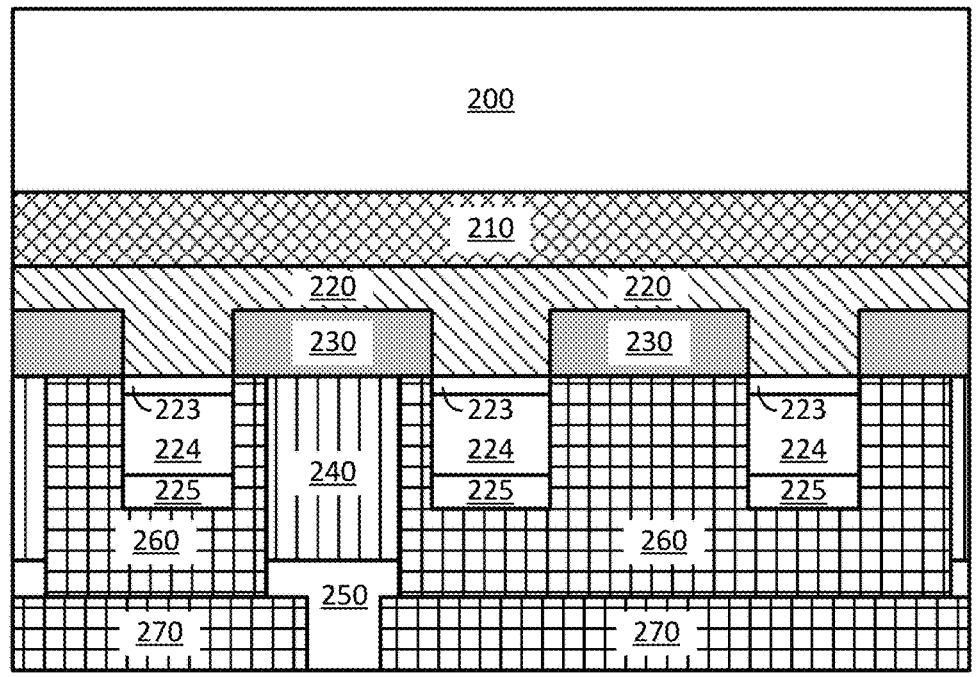
FIG. 3 illustrates the transfer wafer structure of FIG. 2D inverted and being bonded to a host wafer, in accordance with an embodiment of the present disclosure.
Figure 3:
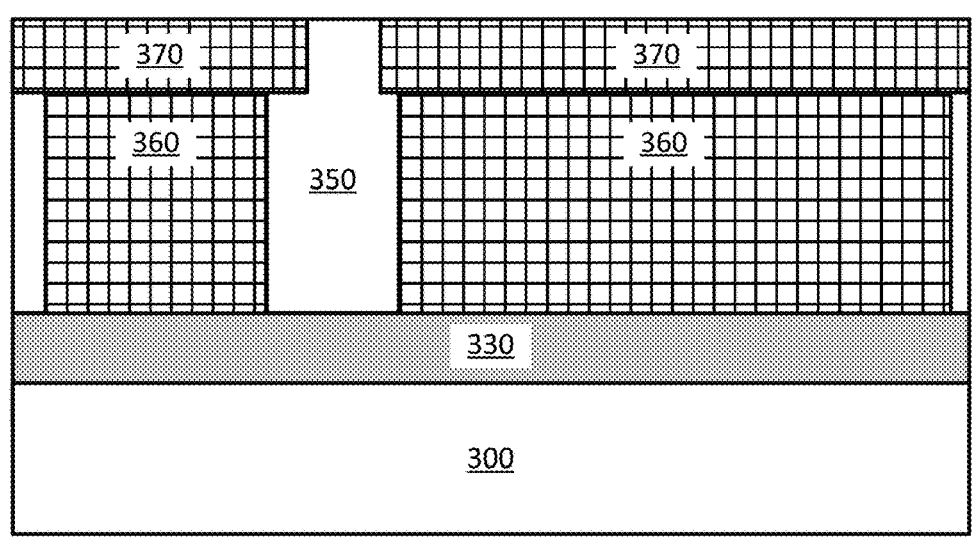
Figure 4:
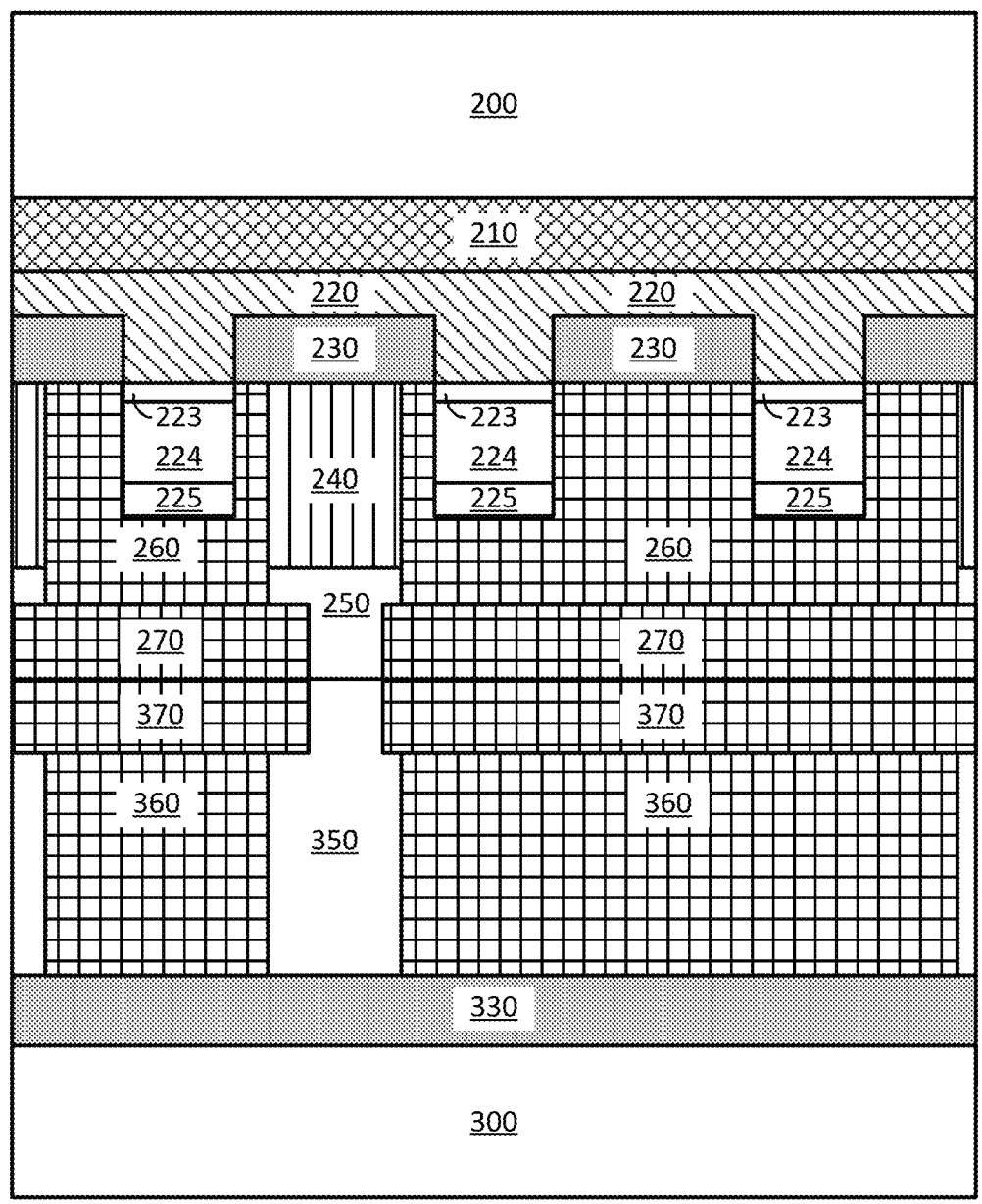
FIGS. 4-4' illustrate an IC structure including a transfer wafer inverted and bonded to a host wafer, where the transfer wafer includes a multilayer substrate, in accordance with some embodiments of the present disclosure. Note that the example IC structure in FIG. 4A' includes the multilayer substrate of FIG. 2A'.
Figure 4:
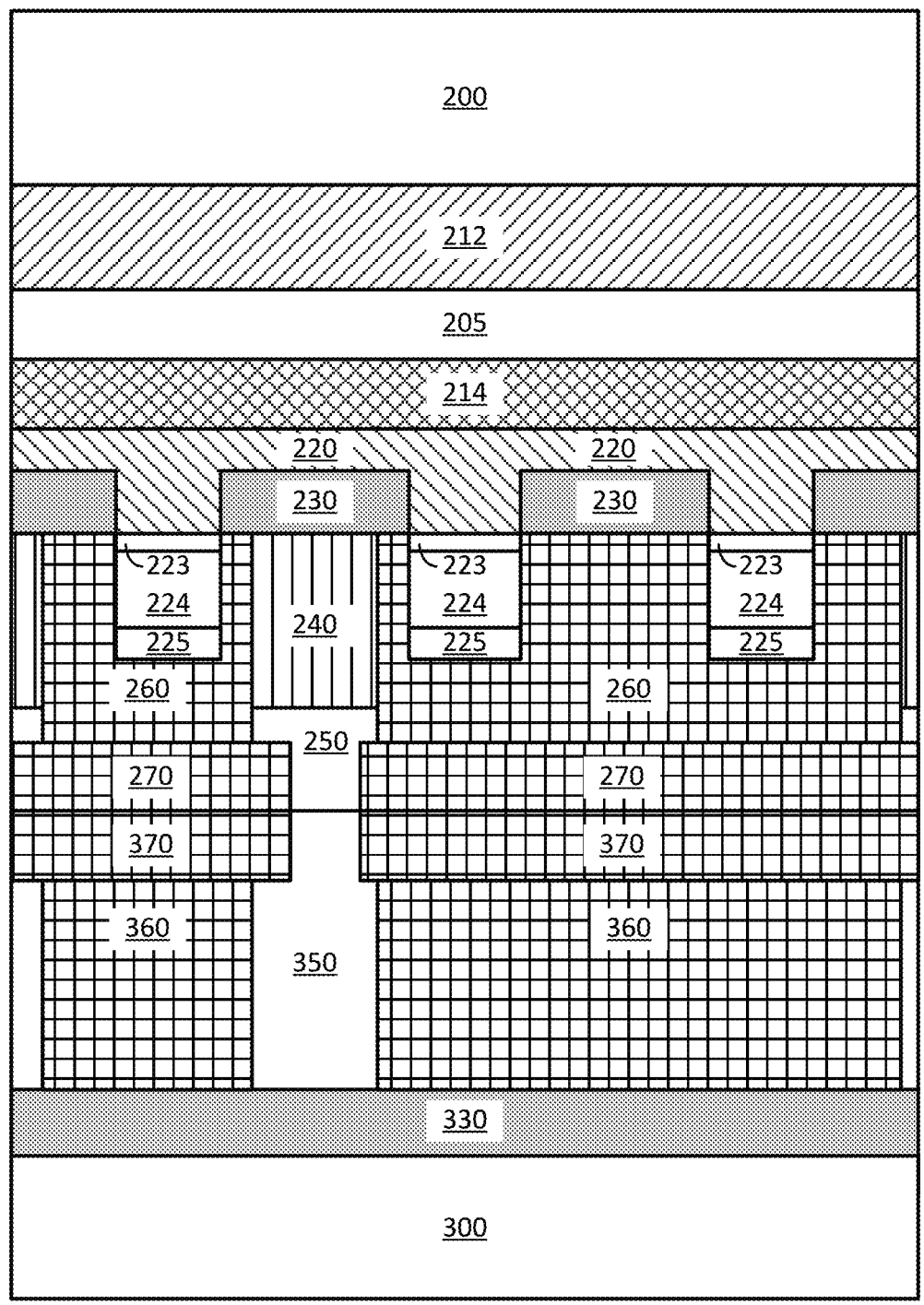

Method 100 of FIG. 1 continues with inverting 112 transfer wafer 20 to be bonded as illustrated in FIG. 3 and bonding the inverted transfer wafer 20 to the host wafer 30 to form the resulting example structure illustrated in FIG. 4, in accordance with an embodiment. As can be understood, transfer wafer structure 20 is the same structure as shown in FIG. 2D, where the one or more transistor devices are formed on a multilayer substrate as variously described herein. The bonding process may be performed using any suitable techniques, such as using any combination of heat, pressure, and/or force to physically connect structure 20 to structure 30. In some cases, the insulator/oxide layers 250 and 350 may be bonded together, such as is shown in FIG. 4. In some cases, the metal lines 270 and 370 may be bonded together, such as is also shown in FIG. 4. Although the example resulting structure illustrated in FIG. 4 shows metal lines 270 and 370 as separate lines, they may be fused together into one line, in some cases. FIG. 4' illustrates the example resulting structure after inversion and bonding 112 is performed, where the transfer wafer to be bonded was formed using the example multilayer substrate of FIG. 2A'. Recall that such an example multilayer substrate includes both a fast-etch layer 212 and an etch-stop layer 214 (as well as a transitional layer 205) between the bulk wafer 200 and the device-quality layer 220.

In some embodiments, host wafer 30 may include its own transistor devices prior to bonding transfer wafer to it. Such one or more transistor devices can include any of the following: field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), vertical channel transistor configurations, and/or nanowire (or nanoribbon or gate-all-around) transistor configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). The materials or device types originally included in the host wafer and the transfer wafer, prior to bonding, may be the similar or they may be different. In an example embodiment, it may be desired to fabricate n-MOS transistors on the host wafer 30 (e.g., n-MOS transistors including InGaAs nanowires), while a transfer wafer 20 may include p-MOS transistors (e.g., Ge tri-gate finned p-MOS devices). In such an example embodiment, an additional transfer wafer may be used to bond graphene planar quantum (e.g., few to single electron) transistor devices, for example. Numerous transistor device material combinations, device geometries, and device type variations and configurations will be apparent in light of this disclosure. In some embodiments, the host wafer may be a mechanical support and have no active electronic function, as it may be removed in a final product. Accordingly, the host wafer may include a non-semiconductor material, such as silicon oxide or silicon nitride or other refractory (e.g., alumina or yittria), to provide a few examples. In another embodiment, the host wafer may be a graphite disc with silicon carbide coating for resistance to chemical attack, for example.

Figure 5A:
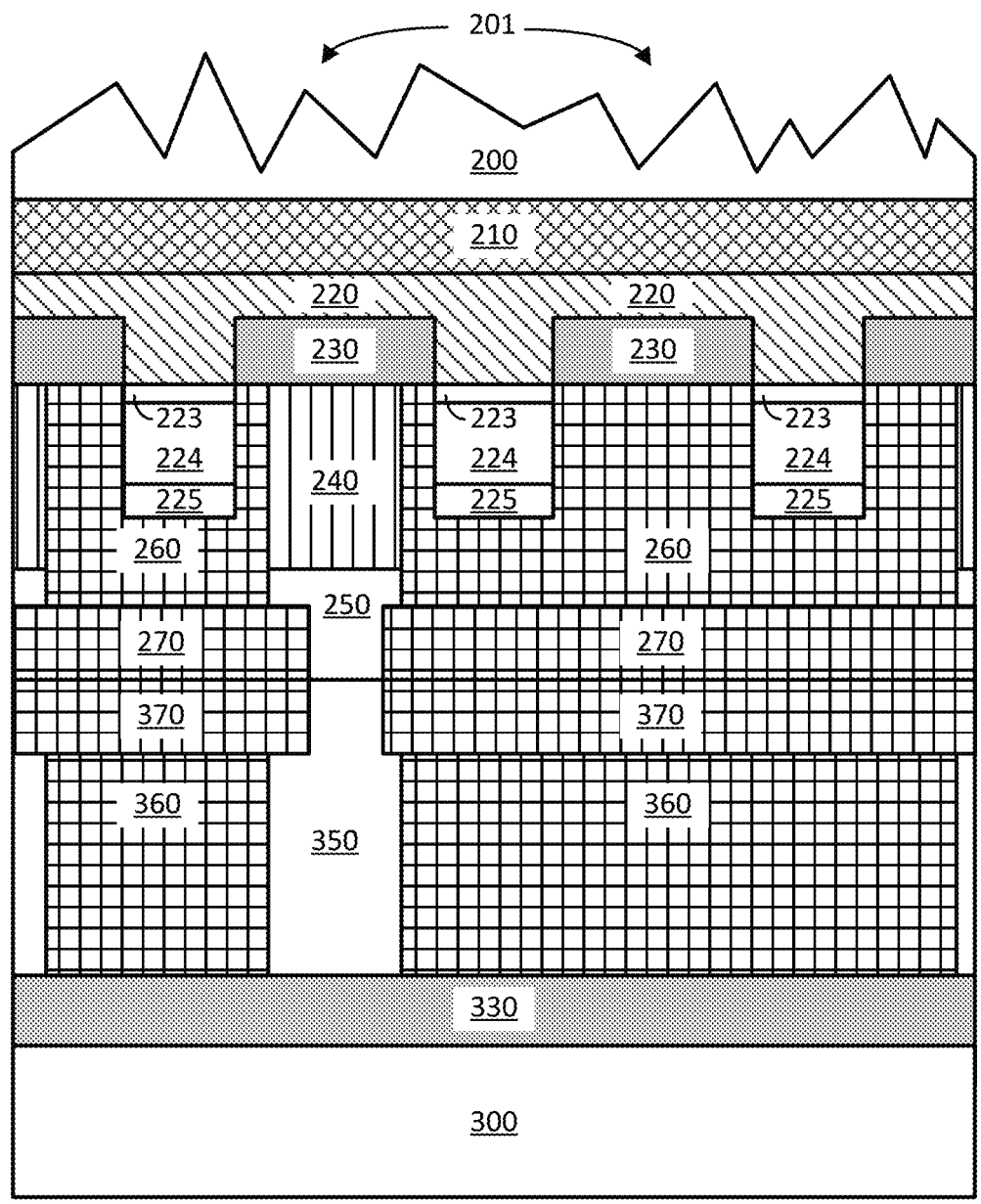
FIGS. 5A-B illustrate resulting IC structures during removal of the bulk wafer layer of the multilayer substrate, in accordance with some embodiments of the present disclosure.
Figure 5A:
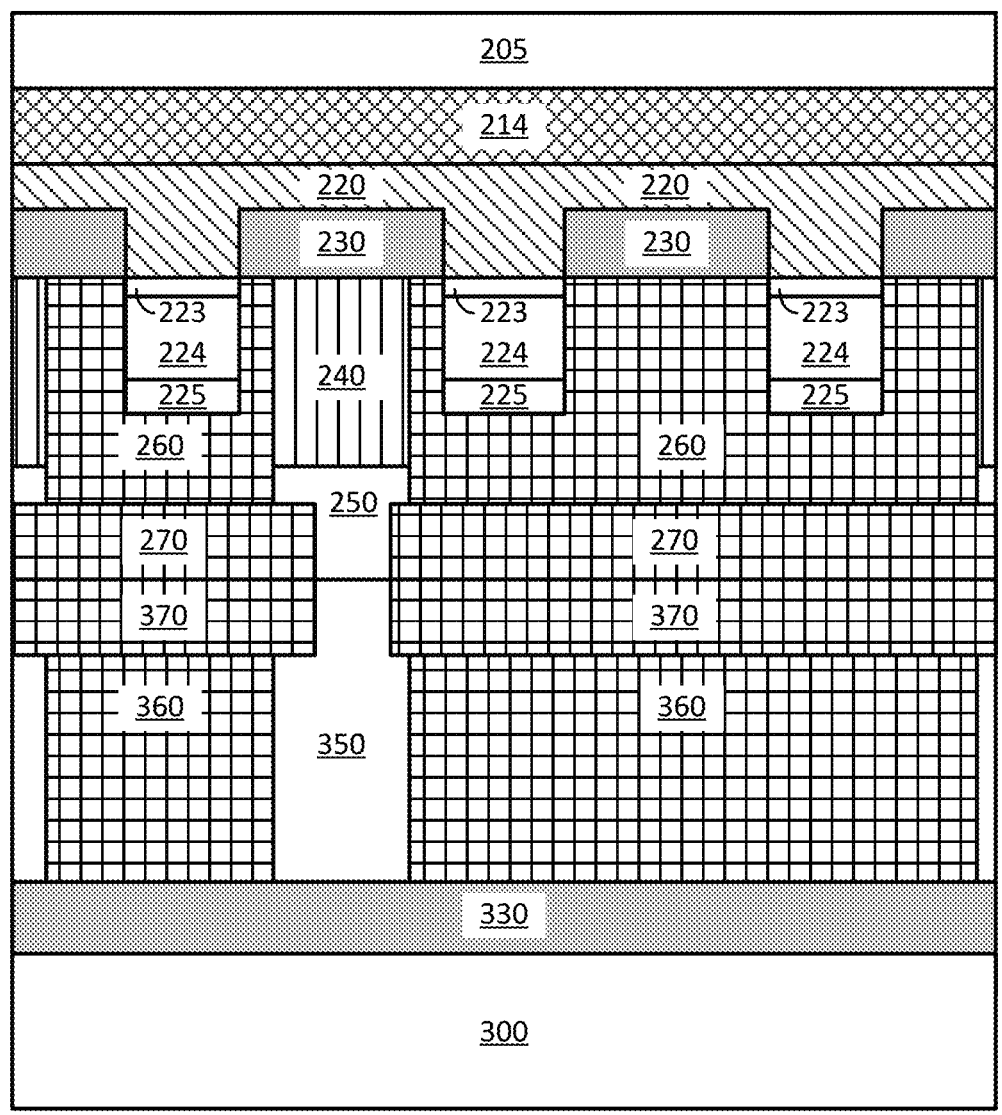

Method 100 of FIG. 1 continues with removing the bulk wafer layer 200 of transfer wafer 20 via either backside grind 114a and etch/polish 115a processes in the case of sacrificial layer 210 being an etch-stop layer or via a lateral etch 114b in the case of sacrificial layer 210 being a fast-etch layer, in accordance with some embodiments. As can be understood, bulk wafer layers 200 and 300 would be significantly thicker than the other layers in the structure of FIG. 4 (e.g., on the order of at least 1000 times thicker, in some cases) and removal of bulk wafer layer 200 would significantly reduce the thickness of the entire structure, thereby enabling a vertical integration scheme. In configurations where sacrificial layer 210 in the example structure of FIG. 4 is an etch-stop layer, removal of bulk wafer layer 200 may include initially performing a backside grind 114a of the bulk wafer layer 200 to form the resulting example structure of FIG. 5A, in accordance with an embodiment. Backside grind 114a may be performed using any suitable techniques, and in some cases, the backside grind may be performed as close to the active transistors (e.g., as close to device-quality layer 220) as practical, owing, for example, to within-wafer process grind thickness uniformity constraints. As can be seen in FIG. 5A, the resulting structure would typically include a rough backside surface 201 of bulk wafer layer 200 after grind 114a has been performed. After backside grind 114a has been performed to remove bulk wafer material to a point that is near or very close to etch-stop layer 210, method 100 can continue by performing an etch and/or polish process 115a to remove the remainder of bulk wafer layer 200.

Figure 5B:
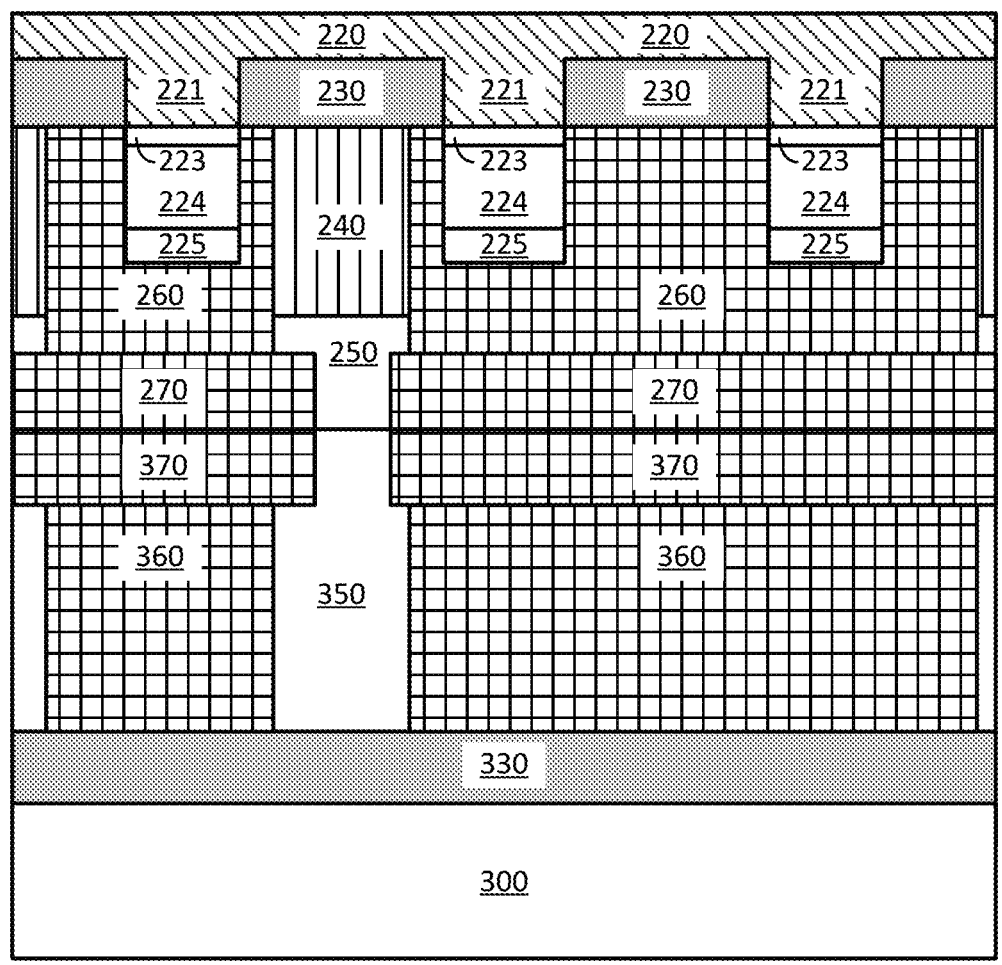

The etch/polish 115a may be performed using any suitable process, based on the material and/or thickness of etch-stop layer 210 (and optionally based on the material/thickness of other layers, such as device-quality layer 220), for example. In some embodiments, etch/polish 115a will remove the entirety of etch-stop layer 210, leaving an example structure such as is illustrated in FIG. 5B. In other embodiments, etch/polish 115a may only partially remove etch-stop layer 210, and thus some of the layer's material may remain on the backside of device-quality layer 220. In some such embodiments, the remaining material of layer 210 may not be present in all locations of the backside of layer 220, as it may be completely removed in some areas and only partially removed in others. In embodiments where bulk wafer layer 200 is Si, an example etchant for etch/polish 115a includes ammonium hydroxide. For example, where bulk wafer layer 200 is Si, an example etch stop material is carbon doped Si (Si:C) with C concentration in the range of 1 to 30%. Numerous different etch-stop materials for layer 210 will be apparent in light of the present disclosure.

In configurations where sacrificial layer 210 in the example structure of FIG. 4 is a fast-etch layer, method 100 may continue from inversion and bonding process 112 by laterally etching 114b the fast-etch layer 210 to release the bulk wafer layer 200, in accordance with an embodiment. Lateral etch 114b can be performed using any suitable process, and in this example embodiment, includes performing a wet etch from the side of the structure to remove fast-etch layer 210, thereby enabling the clean release/liftoff of bulk wafer layer 200. In some embodiments, lateral etch 114b will remove the entirety of fast-etch layer 210, leaving an example structure such as is illustrated in FIG. 5B. In other embodiments, lateral etch 114b may only partially remove fast-etch layer 210, and thus some of the layer's material may remain on the backside of device-quality layer 220. In some such embodiments, the remaining material of layer 210 may not be present in all locations of the backside of layer 220, as it may be completely removed in some areas and only partially removed in others. In any case, use of a fast-etch layer for sacrificial layer 210 may provide the benefit of allowing a clean liftoff of the bulk wafer 200, thereby preserving the wafer for other future uses, for example. In embodiments where the device-quality layer 220 is Si and the transfer bulk wafer 200 to be removed is also Si, an example fast-etch layer 210 is SiGe or SiGe:B and an example etchant for lateral etch 114b is peroxide containing concentrated sulfuric or nitric acid. In embodiments where the device-quality layer 220 is Ge or SiGe with Ge content greater than 80% and the transfer wafer layer 200 to be removed is Si, an example fast-etch layer 210 is GeSn or GeSn:B and an example etchant for lateral etch 114b is buffered dilute nitric or sulfuric acid. In embodiments, where the device-quality layer 220 is SiGe with Ge content of 10-80% and the transfer wafer layer 200 to be removed is Si, an example fast-etch layer 210 is SiGe with approximately 10% or more greater Ge content than the Ge content of the device-quality layer and an example etchant is peroxide containing concentrated sulfuric or nitric acid. In embodiments where the device-quality layer 220 is InGaAs, an example fast-etch layer 210 is GaAs and an example etchant for lateral etch 114b includes a strong base, such as potassium hydroxide or sodium hydroxide. Numerous different fast-etch materials for layer 210 will be apparent in light of the present disclosure.

In the example embodiment illustrated in FIG. 4', recall that the transfer wafer includes a multilayer substrate including both a fast-etch layer 212 and an etch-stop layer 214. In such an example embodiment, removal of bulk wafer layer 200 may include performing lateral etch 114b as previously described to partially or completely remove fast-etch layer 212 and allow for the clean release/liftoff of bulk wafer layer 200. An example resulting structure after the lateral etch 114b is performed is shown in FIG. 5A' (where fast-etch layer 212 was completely removed). The method can then continue with performing etch/polish 115a as previously described to completely remove transitional layer 205 and partially or completely remove etch-stop layer 214. An example resulting structure after the etch/polish 115a is performed is shown in FIG. 5B (where etch-stop layer 214 was completely removed).

Method 100 continues with performing 116 additional back-end processing (which may be referred to as backside-back-end (BBE) processing, as it is on the backside of the device layer from the transfer wafer) to form the example structure of FIG. 6, in accordance with an embodiment of the present disclosure. As can be seen in the example structure of FIG. 6, the additional back-end processing 116 was performed on the backside of the structure 20 added to the host wafer 30, after backside reveal was performed. Such a backside reveal, in this example embodiment, included removing the device layer remainder of device layer 200, except for the sub-fin portions 221, formation of backside contact insulator 280, and the formation of backside contact trenches to make contact to the backside of S/D regions 224. In embodiments where backside etch-stop layer 223 are present (such as is the case in the example structure of FIG. 6), those layers 223 can assist with the backside contact trench etch process, as those layers 223 can provide a stopping point for the etch process. In some embodiments, a single etch process may be used to remove both STI 230 material and device layer and/or sub-fin 221 material, to gain access to the backside of the S/D regions, for example. While in other embodiments, multiple etch processes may be used to gain access to the backside of the S/D regions, for example. After the backside contact trenches are formed, the backside contact resistance reduction techniques include depositing backside contact resistance reduction layer 226, in this example embodiment. In some embodiments, such a contact resistance reduction layer 226 may be formed on the backside portion of one or more S/D regions to assist with ohmic contact from the backside, for example.

In some embodiments, the backside contact resistance reduction layer 226 may include any suitable material, such as group IV and/or group III-V material, or any other suitable material as will be apparent in light of this disclosure. In some embodiments, backside contact resistance reduction layer 226 may include degenerately doped material, such as including n-type and/or p-type dopant concentrations of at least 1E19, 1E20, 5E20, or 1E21 atoms per cubic cm, or some other suitable minimum threshold dopant concentration to assist with ohmic contact. In some embodiments, backside contact resistance reduction layer 226 may include similar material as its respective S/D region 224. In some such embodiments, the material composition of the backside contact resistance reduction layer 226, relative to the S/D region(s) 224 for which the backside contact resistance reduction layer 226 is used, may be different than the material composition of that S/D region(s) 224. For instance, in the example case of a SiGe S/D region, a backside contact resistance reduction layer for that SiGe S/D region may also include SiGe, but with a relatively increased percentage of Ge in the SiGe material. Further, in the example case of an InGaAs S/D region, a backside contact resistance reduction layer or portion for that InGaAs S/D region may also include InGaAs, but with a relatively increased percentage of In in the InGaAs material. To provide more specific examples, for illustrative purposes, in an embodiment including an Si channel p-MOS having SiGe:B S/D regions with 3E20 B atoms per cubic cm, a backside contact resistance reduction layer for the S/D regions may include SiGe:B with 5E20 B atoms per cubic cm or Ge with 5E20 B atoms per cubic cm, for instance. In another example case, in an embodiment including an Si channel n-MOS having Si:P S/D regions with 5E20 P atoms per cubic cm, a backside contact resistance reduction layer for the S/D regions may include Si:P with 1E21 P atoms per cubic cm. In some embodiments, backside contact resistance reduction layer 226 may include a doping concentration (e.g., of any suitable n-type or p-type dopants) that is at least 1E17 to 1E21 atoms per cubic cm (e.g., at least 1E20 atoms per cubic cm) greater than the dopant concentration of the S/D regions 224 for which it is providing contact resistance reduction, or some other suitable relative amount as will be apparent in light of this disclosure.

After contact resistance reduction layer 226 has been formed, the back-end processing may include forming backside contact layer 290, as shown in the example embodiment of FIG. 6. Backside contact layer or feature 290 can be formed by depositing the backside contact material in the remainder of the backside contact trench after forming backside contact resistance reducing layer 226, for example. In some embodiments, backside contact 290 formation may include silicidation, germinidation, or annealing processes, for example. The material of backside contact 290 may include aluminum or tungsten, although any suitable conductive metal or alloy (or other suitable electrically conductive material) can be used, such as silver, nickel-platinum, or nickel-aluminum, for example. In some embodiments, backside contacts 290 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain backside contact regions, such as adhesion layers (e.g., titanium nitride) and/or liner or barrier layers (e.g., tantalum nitride), if so desired.

In this example embodiment, the backside back-end processing also included forming ILD layer 480 and metallization layer/line 470. Metallization layer 270 may be formed using any suitable processes and may be formed of any suitable material, such as copper or aluminum, for example. In this example embodiment, only one metal line/level 270 is shown for ease of illustration; however, any number of backside-back-end (BBE) layers may be formed. Insulator 480 may be formed using any suitable processes and may be formed of any suitable material, such as a dielectric material, for example. In some embodiments, additional and/or alternative backside-back-end (BBE) processing may be performed, as will be apparent in light of this disclosure. Note that in some embodiments, S/D regions may be contacted from the frontside only, the backside only, or both the frontside and the backside, as can be understood based on this disclosure. Also note that, in some embodiments, the backside contact resistance reduction techniques may be used if making contact to the transistor gate from the backside, for example. In some such embodiments, the backside resistance reduction techniques may include suitable material and configurations that would be applicable to the gate, as opposed to the S/D regions, for example. For instance, such resistance reducing techniques may be particularly relevant to nanowire or nanoribbon transistor configurations (e.g., gate-all-around (GAA) transistor configurations), where the channel is surrounded by the gate on both the frontside and the backside, making such a transistor configuration suitable for the contact resistance reduction techniques and principles described herein.

As can be seen in FIG. 6, the active device portion of the structure (e.g., the portion including the channel region and the source and drain regions) has a thickness indicated as T7. In some cases, thickness T7 may be less than 200, 100, 50, or 25 nm, or any other suitable maximum thickness, depending on the end use or target application. Recall that various example transistor device geometries that can benefit from the MOBS integration techniques and backside contact resistance reduction techniques described herein include, but are not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), vertical channel configurations, and nanowire (or nanoribbon or gate-all-around) transistor configurations. In addition, the techniques may be used to vertically integrate p-type transistor devices (e.g., p-MOS or p-TFET) and/or n-type transistor devices (e.g., n-MOS or n-TFET). Further, the techniques may be used to vertically integrate complementary MOS (CMOS) or complementary TFET (CTFET) devices or quantum devices (few to single electron). Numerous variations and configurations on method 100 and the integration techniques and structures described herein will be apparent in light of the present disclosure.

Figure 7C:
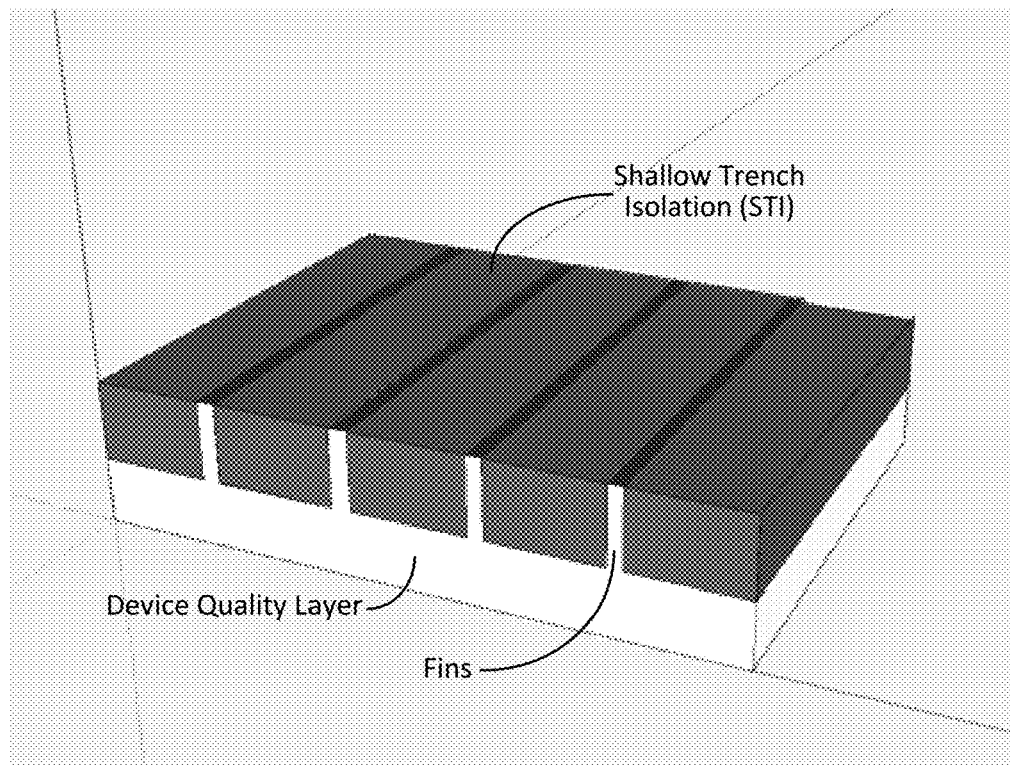
Figure 7D:
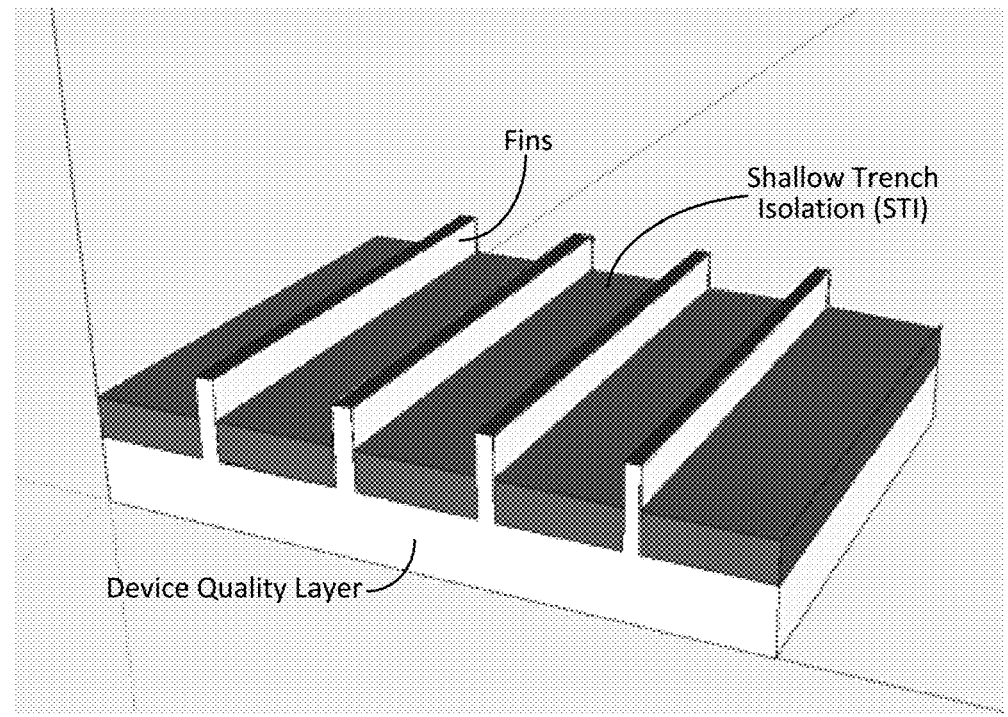
Figure 7E:
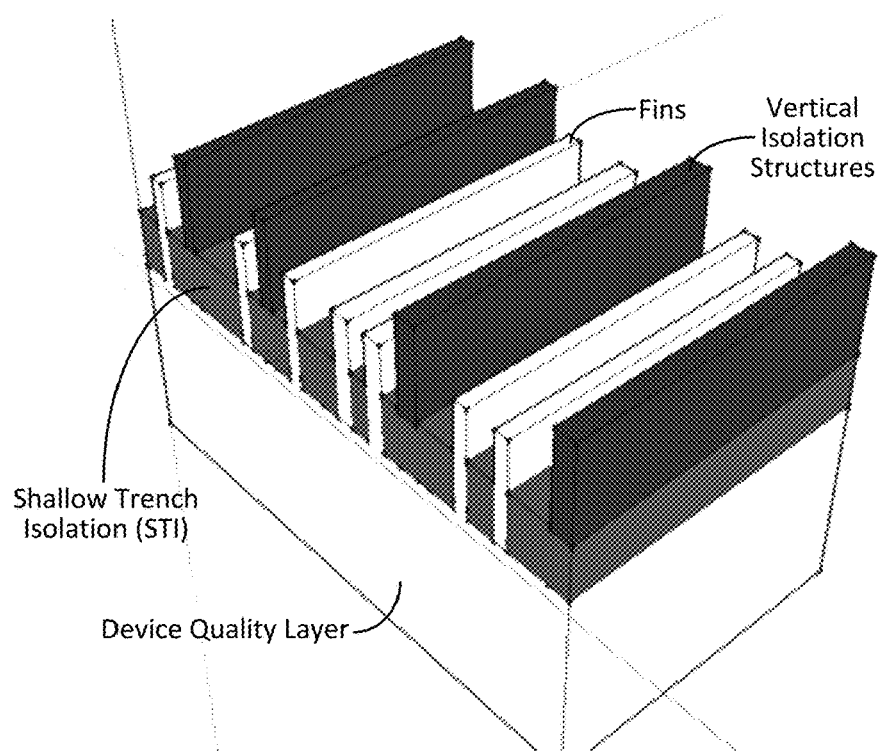

FIGS. 7A-M illustrate perspective views of example IC structures formed when carrying out the method 100 of FIG. 1, in accordance with some embodiments of the present disclosure. The previous relevant description provided herein is equally applicable to the example structures of FIGS. 7A-M. FIG. 7A illustrates a device quality layer with hard mask strips that have been lithographically patterned and etched onto the device quality layer. As can be understood based on this disclosure, the device quality layer may be similar to layer 220 as variously described herein. Therefore, in some embodiments, the device quality layer may be formed on a transfer wafer including a bulk wafer/substrate (e.g., bulk substrate/wafer 200 described herein) and one or more layers to form a multilayer substrate that enables transfer-to-host-wafer integration for backside reveal purposes, which can be used in a MOBS integration scheme. As can be seen in FIG. 7A, the multilayer substrate is not shown for ease of illustration. However, in some embodiments, the device quality layer may be formed with any suitable multilayer substrate configuration (such as one of the multilayer substrates shown in FIG. 2A or 2A' and variously described herein), for example. In this example embodiment, device quality layer may include any suitable semiconductor material, such as a group IV and/or a group III-V material. The hard mask strips shown may all be of a single width or multiple widths to form, respectively, fins of a single width or multiple widths, as can be understood. The hard mask strips may include any suitable material, such as a dielectric material, for example.

The method continues with performing one or more shallow trench recess (STR) etches (e.g., one or more wet and/or dry etches) to form multiple fins from the device quality layer, as shown in FIG. 7B, in accordance with an embodiment. As is also shown, the fins are separated by fin trenches. Note that although the fins and fin trenches all have similar dimensions, the present disclosure is not intended to be so limited. For example, in some embodiments, fins of varying heights (dimension in the Y direction) and widths (dimension in the X direction) may be formed, as well as fin trenches of varying heights and widths, as can be understood based on this disclosure. The method continues with shallow trench isolation (STI) processing to form the example structure of FIG. 7C, in accordance with an embodiment. Such STI may be processed and include material similar to STI 230 variously described herein, for example. The method continues with recessing the STI material to form the example structure of FIG. 7D, in accordance with an embodiment. Such a recess of the STI material may be performed using any suitable techniques. In some embodiments, vertical isolation structures may be formed to, for example, further isolate (or electrically insulate) single fins or groups of fins. For instance, in the example structure of FIG. 7E, such vertical isolation structures are present and may be included to prevent the eventual S/D of one transistor device from shorting the S/D of another (e.g., neighboring) transistor device by ensuring the respective S/D regions stay separate. Accordingly, such vertical isolation structures may be formed using any suitable techniques and they may include any suitable material, such as a dielectric, oxide, nitride, and/or carbide material, for instance. Note that although the vertical isolation structures (shown in black) are higher (dimension in the Y direction) than the semiconductor fins, the present disclosure is not intended to be so limited. The method will continue using the example structure of FIG. 7E to assist with illustrating subsequent IC structures including the vertical isolation structures. However, such vertical isolation structures need not be present in some embodiments.

Figure 7F:
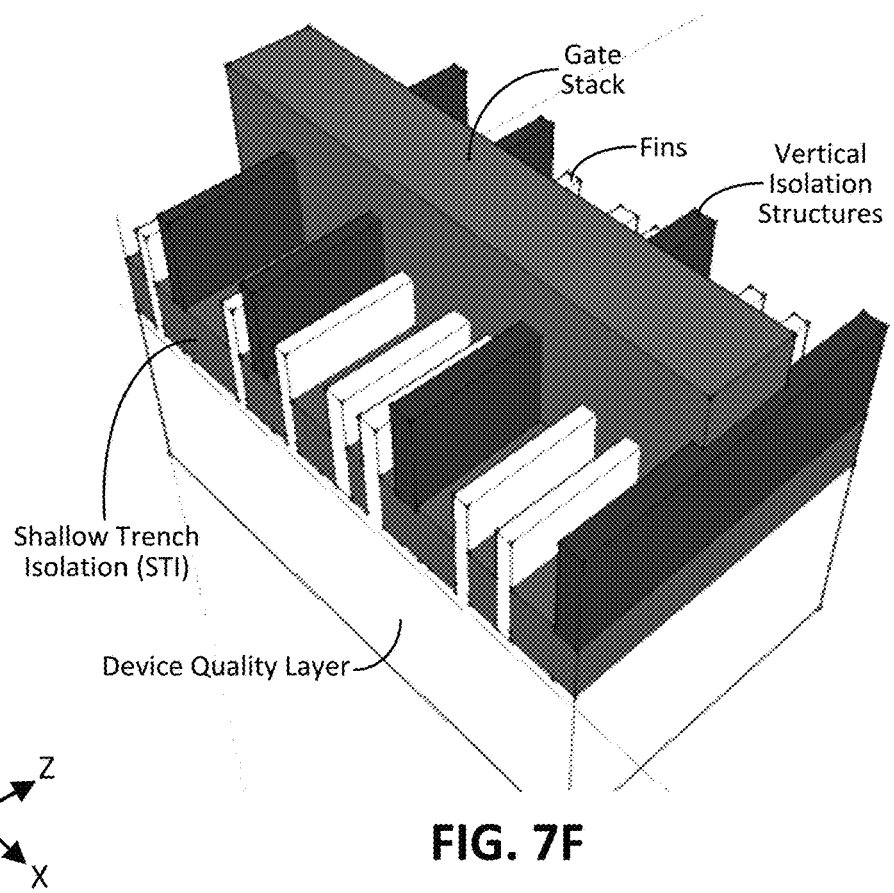

The method continues with gate stack processing to form the example structure of FIG. 7F, in accordance with an embodiment. Such gate stack processing, in some embodiments, may include a gate first or gate last process. For instance, in a gate first process, the final gate stack (e.g., including the gate dielectric and the gate) and may be formed at this stage, while in a gate last process, the gate stack formed in FIG. 7 may be a dummy gate stack that will be later replaced by the final gate stack. Further note that the channel regions (the portions of the fins under the gate stack) may employ native substrate material or replacement material, either of which may be undoped or doped (e.g., with any suitable n-type or p-type dopants). In the case of replacement material channel, the replacement material may be blanket deposited and subsequently formed into fins or the native fins may be converted into trenches in the STI and refilled epitaxially, for example. The channel material may include any suitable group IV semiconductor material (e.g., Si, Ge, SiGe) or group III-V semiconductor material (e.g., InGaAs, GaAs, InGaSb, InP), or any other suitable material as will be apparent in light of this disclosure. Note that in the case of the IC structure including both n-channel and p-channel transistors, the channel material for both such transistors may be the same or different.

Figure 7G:
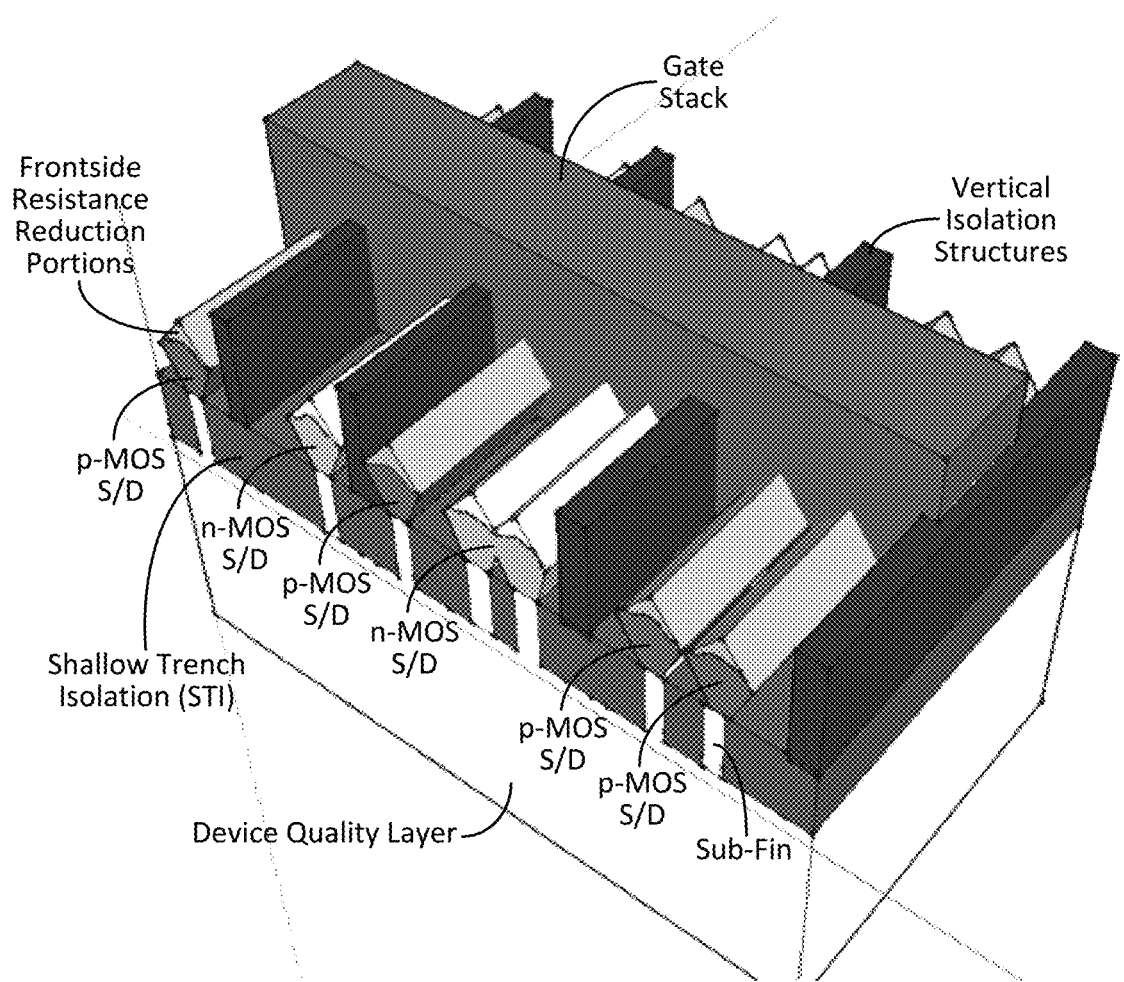

The method continues with S/D processing to form the example structure of FIG. 7G, in accordance with an embodiment. In this example embodiment, the S/D regions of the fins were replaced through a process of masking, etching, and deposition of the replacement material, which may be performed one polarity at a time (e.g., one of the n-type and p-type S/D regions and then the other of the n-type and p-type S/D regions). As described herein, the replacement S/D regions may start with a backside etch-stop layer to assist with having a well-controlled etch depth during the backside S/D contract trench formation. As was also described, such an etch-stop layer (not shown in the example structure of FIG. 7G) may include a thin (e.g., 1-5 nm) layer of carbon rich Si:P:C and/or SiGe:B:C material, which may be used as an initiation layer for p-type and/or n-type S/D deposition. During the S/D processing, the active channel region is protected by the gate stack, for example. The S/D regions also each include frontside resistance reduction portions as shown in FIG. 7G, which may be processed and include material similar to frontside resistance reduction layers/portions 225 as variously described herein, for example. Note that the lighter S/D regions are labelled as n-type or n-MOS S/D regions, while the darker S/D region are labelled as p-type or p-MOS S/D regions for illustrative purposes only, to be able to demonstrate that the techniques described herein can be used for both p-type and n-type devices, and can even be used for complementary (e.g., CMOS) devices, as will be apparent in light of this disclosure.

Figure 7H:
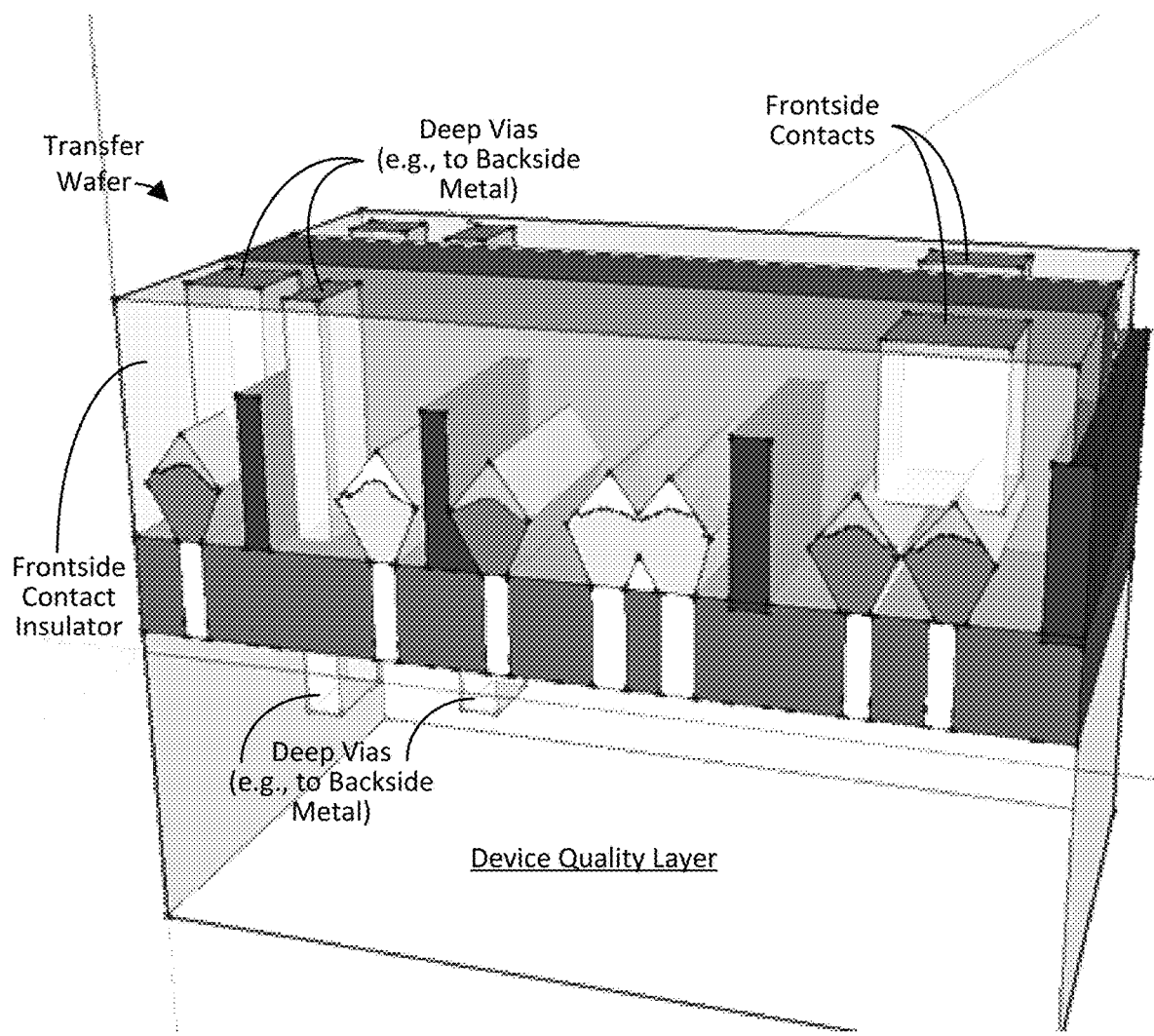
Figure 7I:
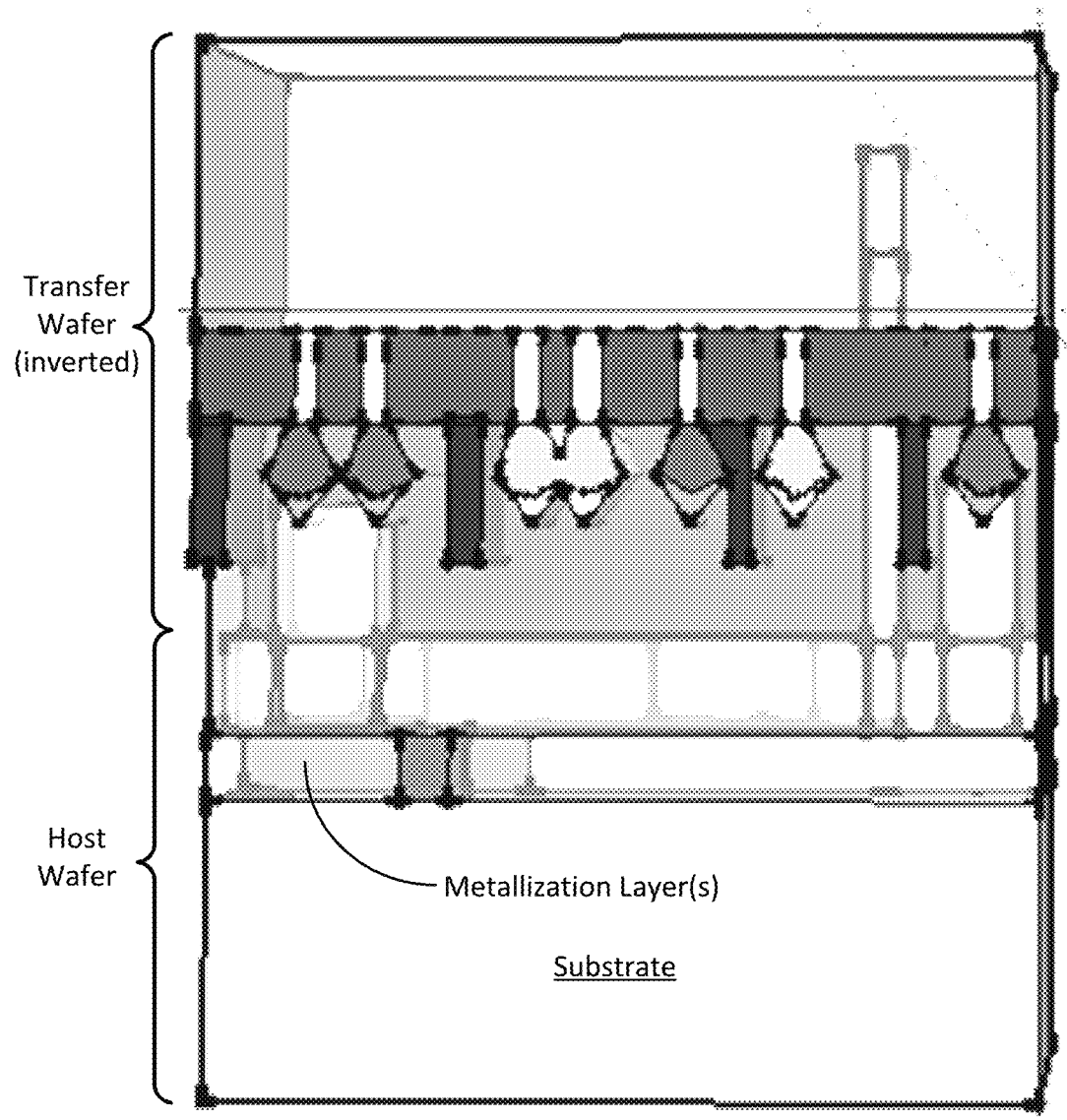

The method continues with forming contacts and/or vias as shown in the example structure of FIG. 7H, in accordance with an embodiment. In some embodiments, such processing may include depositing frontside contact insulator, planarizing/polishing the structure, forming contact/via trenches, and depositing the contact/via material (e.g., metal or metal alloy material). Note that not every S/D region need have a contact from the frontside (the top, as shown in FIG. 7H). Also note that some of the vias are made very deep, such as through to the backside of the structure to allow interconnections through the device layer, for example. The method continues with back-end metallization processing to form one or more metallization layers, in some embodiments. After the transfer wafer has been processed to a desired structure, that transfer wafer (which may be referred to as the device wafer, as it includes one or more transistor devices) can be inverted and bonded to a host (or carrier) wafer, as variously described herein. The resulting structure after the inverting and bonding has been performed is shown in FIG. 7I, where there are one or more layers of metallization (specifically two, in this example embodiment) between the substrate of the host wafer and the transistor device level.

Figure 7J:
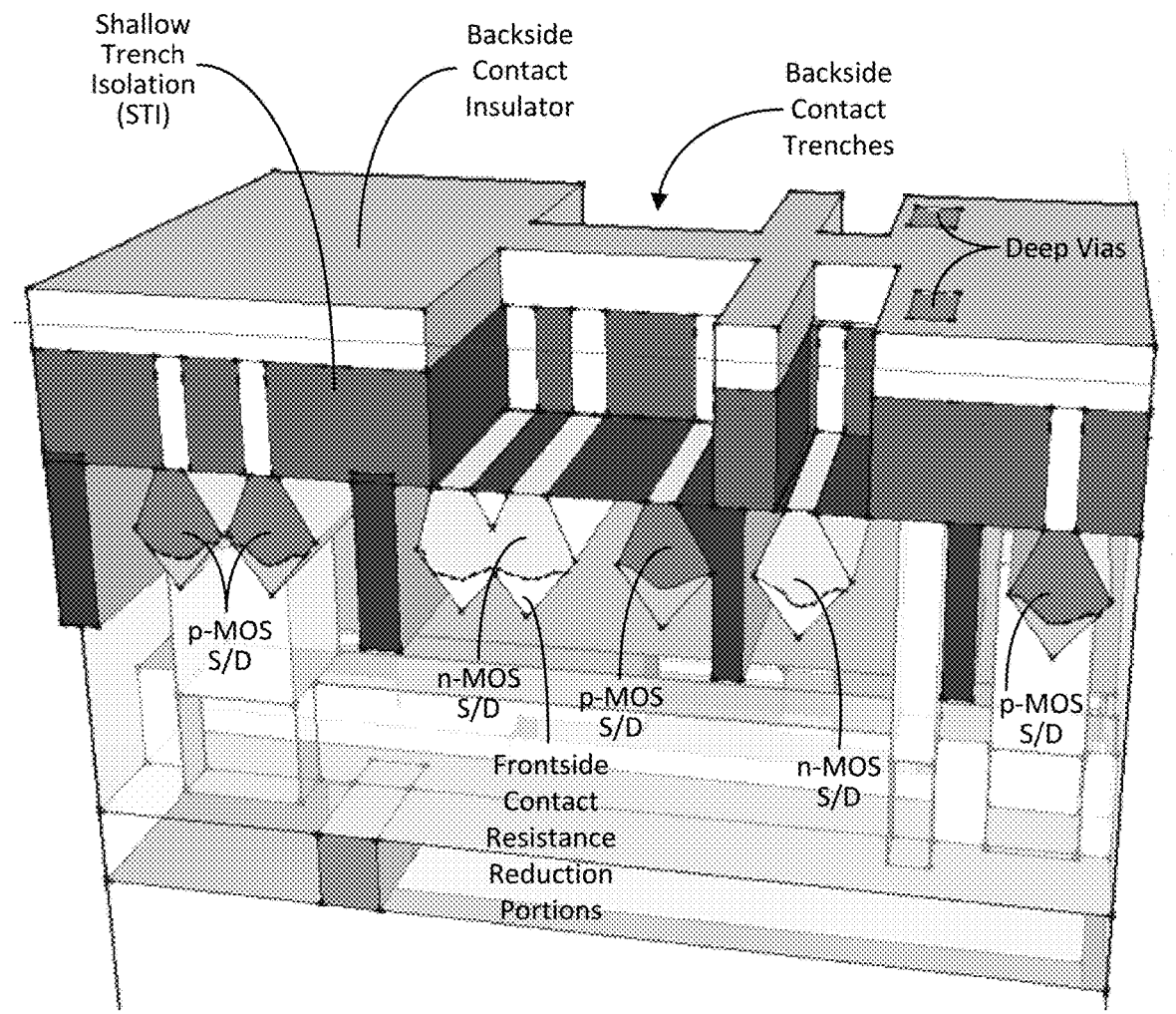

The method continues with performing backside reveal, depositing backside contact insulator, and forming backside contact trenches to form the example structure of FIG. 7J, in accordance with an embodiment. In some embodiments, the backside reveal processing may be performed using any suitable techniques, such as via grinding, etching, and/or CMP, as is variously described herein. After the backside reveal reaches, for example, the shallow trench isolation layer, the backside contact insulator layer may be deposited, which may include any suitable dielectric material, for example. Then, backside contact trenches can be formed, as shown in FIG. 7J, using any suitable techniques, such as one or more wet and/or dry etch processes. Recall that the inclusion of a backside etch-stop layer may assist in forming the backside contact trenches by allowing the trench processing to stop at the appropriate level, for example. Note that the deep vias are indicated, as they can be used to make contact to the metallization layers below the transistor devices (e.g., on the frontside of the transistors).

Figure 7K:
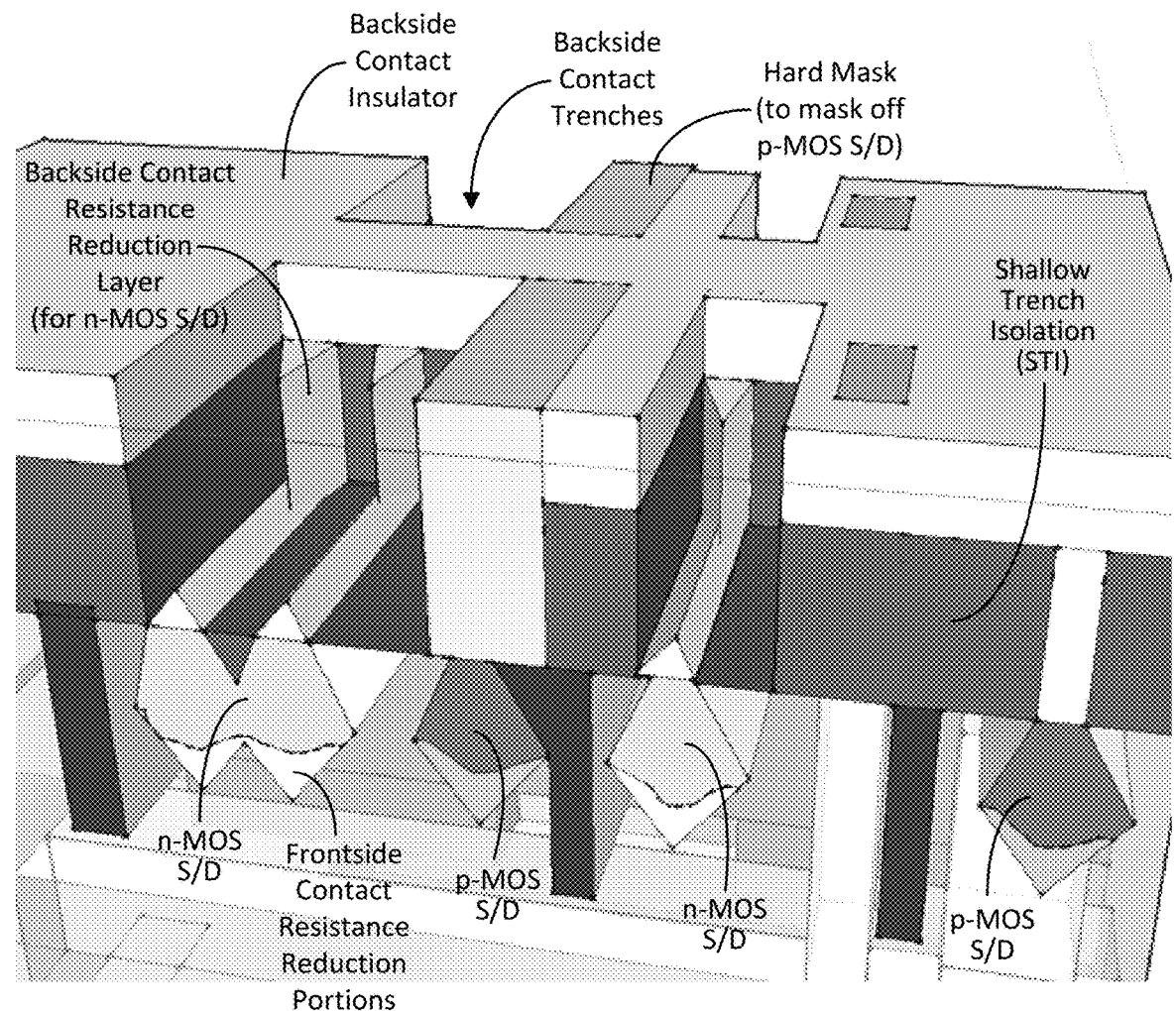
Figure 7L:
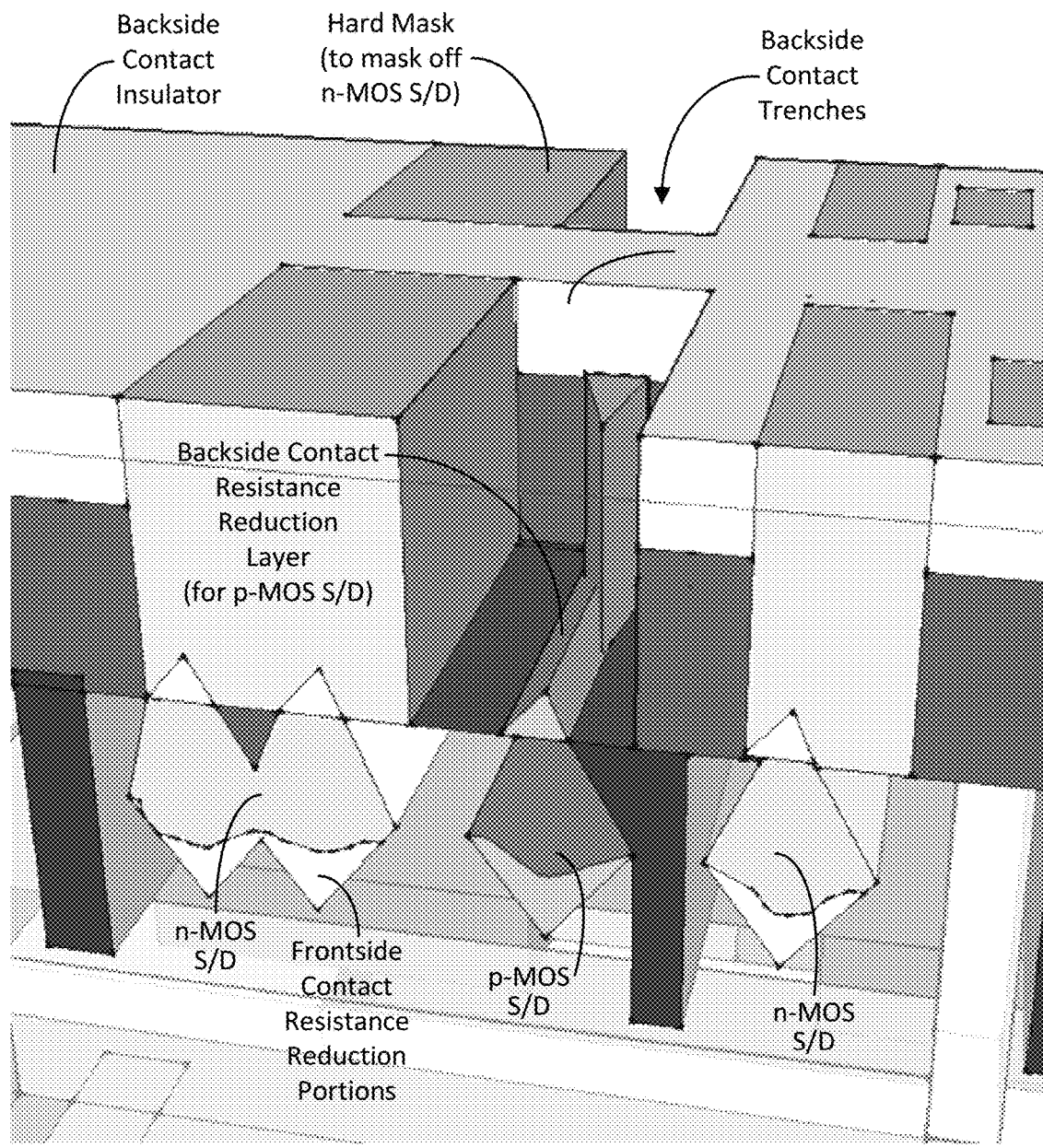

In some embodiments, p regions (e.g., for p-MOS) and n regions (e.g., for n-MOS) may be located in the same backside contact trench, for example. In some such embodiments, masking may be used to ensure that backside contact resistance reduction processing occurs on the correct polarity. For instance, as shown in FIG. 7K, the p-MOS S/D in the backside contact trenches has been masked off using hard mask material, which may be formed using any suitable techniques and may include any suitable dielectric material, for example. After the p-MOS S/D has been masked off, the backside contact resistance reduction layer for the n-MOS S/D was deposited as shown in FIG. 7K, which may be processed and include material similar to backside resistance reduction layer 226 as variously described herein, for example. For instance, as the backside resistance reduction layer is for the n-MOS S/D, in the example structure of FIG. 7K, it may include very heavily (e.g., greater than 5E20 atoms per cubic cm) n-type doped material to promote ohmic contact to the n-type S/D regions, for example. The process can be repeated for the backside resistance reduction layer for the p-MOS S/D by removing the hard mask over those regions and forming hard mask over the n-MOS S/D to form the example structure of FIG. 7L, for example. After the n-MOS S/D has been masked off, the backside resistance reduction layer for the p-MOS S/D was deposited as shown in FIG. 7L, which may be processed and include material similar to backside resistance reduction layer 226 as variously described herein, for example. For instance, as the backside resistance reduction layer is for the p-MOS S/D, in the example structure of FIG. 7L, it may include very heavily (e.g., greater than 5E20 atoms per cubic cm) p-type doped material to promote ohmic contact to the p-type S/D regions, for example.

Figure 7M:
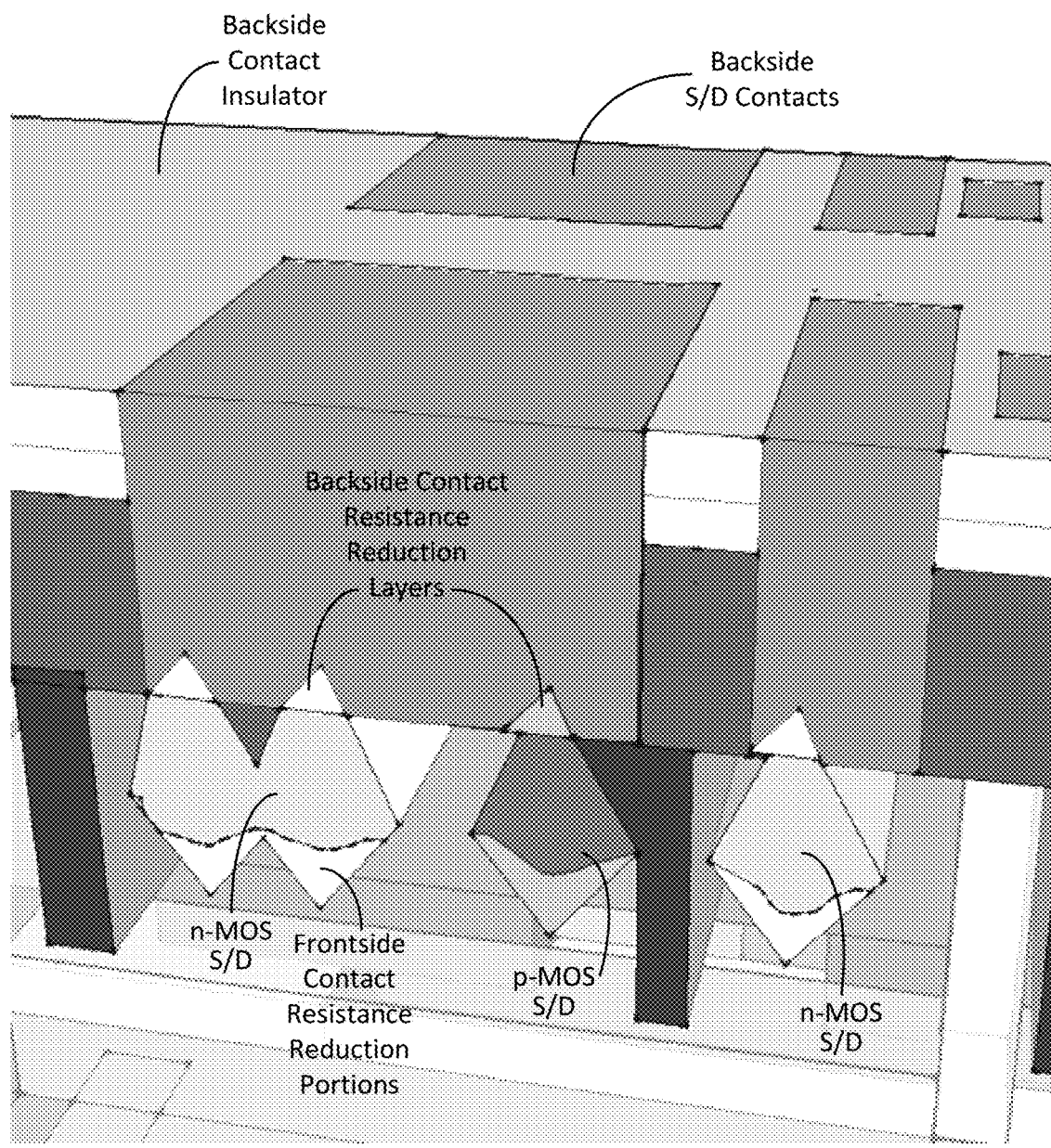

The method continues with removing the hard mask from the example IC structure of FIG. 7L and forming backside contacts in the backside contact trench locations, to form the example structure of FIG. 7M, in accordance with an embodiment. In some such embodiments, the backside contacts may be processed and include material similar to backside contact 290 as variously described herein, for example. For instance, the trenches may be filled with metal or metal alloy using silicide/germanide and an optional diffusion barrier, in some embodiments. Note that contacts can be made from both the frontside and the backside to the same S/D, but in some embodiments, contacts are made from one or the other. The backside-back-end processing (which may be referred to as BBE processing) may then include forming as many metallization layers/lines as desired. Numerous variations and configurations will be apparent in light of this disclosure.

Example System

Figure 8:
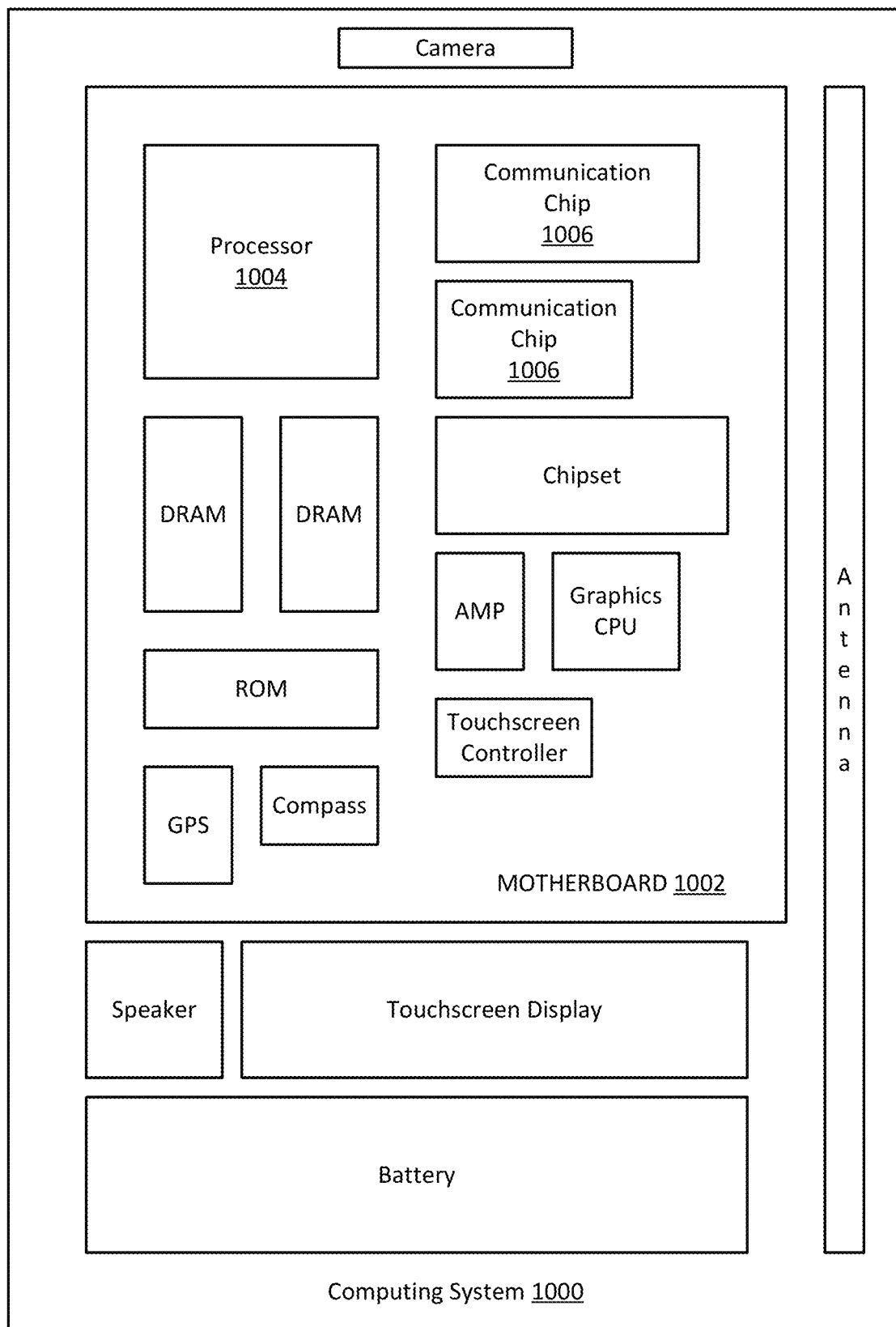
FIG. 8 illustrates a computing system implemented with integrated circuit structures or devices formed using the techniques disclosed herein, in accordance with an embodiment of the present disclosure.

FIG. 8 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit (IC) including: a substrate; a transistor above the substrate and including a layer of single-crystal semiconductor material; at least one metallization layer below the transistor and between the transistor and the substrate; and at least one metallization layer above the transistor. The transistor includes: a gate; a channel above the gate; and source and drain (S/D) regions adjacent to the channel, wherein the source region includes a first dopant concentration and wherein the drain region includes a second dopant concentration; a contact layer above at least one of the S/D regions; and a contact resistance reducing layer between the contact layer and the at least one of the S/D regions, wherein the contact resistance reducing layer includes a third dopant concentration that is at least 1E20 atoms per cubic centimeter (cm) greater in concentration than each of the first and second dopant concentrations.

Example 2 includes the subject matter of Example 1, wherein the layer of single-crystal semiconductor material includes less than 1E8 dislocation or grain boundary defects per square cm.

Example 3 includes the subject matter of any of Examples 1-2, wherein the layer of single-crystal semiconductor material includes at least one of group IV semiconductor material and group III-V semiconductor material.

Example 4 includes the subject matter of any of Examples 1-3, wherein the transistor further includes a gate dielectric layer between the gate and the channel.

Example 5 includes the subject matter of any of Examples 1-4, wherein the S/D regions include one of n-type and p-type dopants.

Example 6 includes the subject matter of any of Examples 1-5, wherein the first and second dopant concentrations are approximately equal to or less than 5E20 atoms per cubic cm.

Example 7 includes the subject matter of any of Examples 1-6, wherein the contact layer includes one of a metal and metal alloy material.

Example 8 includes the subject matter of any of Examples 1-7, wherein the contact resistance reducing layer includes at least one of group IV semiconductor material and group III-V semiconductor material.

Example 9 includes the subject matter of any of Examples 1-8, wherein the contact resistance reducing layer includes composite material included in the S/D regions, but with greater concentration of at least one constituent of the composite material.

Example 10 includes the subject matter of any of Examples 1-9, wherein the contact resistance reducing layer includes one of n-type and p-type dopants.

Example 11 includes the subject matter of any of Examples 1-10, wherein the third dopant concentration is approximately equal to or greater than 5E20 atoms per cubic cm.

Example 12 includes the subject matter of any of Examples 1-11, wherein the third dopant concentration is at least 3E20 atoms per cubic cm greater in concentration than each of the first and second dopant concentrations.

Example 13 includes the subject matter of any of Examples 1-12, further including a carbon doped layer between the contact resistance reducing layer and the at least one of the S/D regions.

Example 14 includes the subject matter of any of Examples 1-13, wherein the transistor includes one of a planar configuration, a finned configuration, and a nanowire configuration.

Example 15 includes the subject matter of any of Examples 1-14, wherein the transistor is one of a p-channel metal-oxide-semiconductor field-effect transistor (p-MOS) and an n-channel metal-oxide-semiconductor field-effect transistor (n-MOS)

Example 16 is a complementary metal-oxide-semiconductor (CMOS) device including the subject matter of any of Examples 1-15.

Example 17 is a computing system including the subject matter of any of Examples 1-16.

Example 18 is an integrated circuit (IC) including: a substrate; a plurality of transistors above the substrate; at least one metallization layer below the plurality of transistors and between the plurality of transistors and the substrate; and at least one metallization layer above the plurality of transistors. Each transistor of the plurality of transistors includes: a gate; a channel above the gate; and source and drain (S/D) regions adjacent to the channel, wherein the source region includes a first dopant concentration and wherein the drain region includes a second dopant concentration; a contact layer at least one of above and below each S/D region; and a contact resistance reducing layer between each contact layer and each S/D region, wherein the contact resistance reducing layer includes a third dopant concentration that is at least 1E19 atoms per cubic centimeter (cm) greater in concentration than each of the first and second dopant concentrations.

Example 19 includes the subject matter of Example 18, wherein at least one of the plurality of transistors is an n-channel transistor and wherein at least one of the plurality of transistors is a p-channel transistor.

Example 20 includes the subject matter of any of Examples 18-19, wherein a contact layer is both above and below at least one S/D region.

Example 21 includes the subject matter of any of Examples 18-20, wherein the channel includes at least one of group IV semiconductor material and group III-V semiconductor material.

Example 22 includes the subject matter of any of Examples 18-21, wherein each transistor further includes a gate dielectric layer between the gate and the channel.

Example 23 includes the subject matter of any of Examples 18-22, wherein each S/D region includes one of n-type and p-type dopants.

Example 24 includes the subject matter of any of Examples 18-23, wherein the first and second dopant concentrations are approximately equal to or less than 5E20 atoms per cubic cm.

Example 25 includes the subject matter of any of Examples 18-24, wherein each contact layer includes one of a metal and metal alloy material.

Example 26 includes the subject matter of any of Examples 18-25, wherein each contact resistance reducing layer includes at least one of group IV semiconductor material and group III-V semiconductor material.

Example 27 includes the subject matter of any of Examples 18-26, wherein at least one contact resistance reducing layer includes composite material included in corresponding S/D regions, but with greater concentration of at least one constituent of the composite material.

Example 28 includes the subject matter of any of Examples 18-27, wherein each contact resistance reducing layer includes one of n-type and p-type dopants.

Example 29 includes the subject matter of any of Examples 18-28, wherein the third dopant concentration is approximately equal to or greater than 5E20 atoms per cubic cm.

Example 30 includes the subject matter of any of Examples 18-29, wherein the third dopant concentration is at least 3E20 atoms per cubic cm greater in concentration than each of the first and second dopant concentrations.

Example 31 includes the subject matter of any of Examples 18-30, further including a carbon doped layer between at least one contact resistance reducing layer and the corresponding S/D regions.

Example 32 includes the subject matter of any of Examples 18-31, wherein each transistor includes one of a planar configuration, a finned configuration, and a nanowire configuration.

Example 33 includes the subject matter of any of Examples 1-14, wherein each transistor is one of a p-channel metal-oxide-semiconductor field-effect transistor (p-MOS) and an n-channel metal-oxide-semiconductor field-effect transistor (n-MOS)

Example 34 is a complementary metal-oxide-semiconductor (CMOS) device including the subject matter of any of Examples 18-33.

Example 35 is a computing system including the subject matter of any of Examples 18-34.

Example 36 is a method of forming an integrated circuit, the method including: providing a first substrate; depositing a sacrificial layer on the first substrate; forming a single-crystal semiconductor material layer on the sacrificial layer; forming a transistor including the semiconductor material layer, the transistor including a gate, a channel below the gate, and source and drain (S/D) regions adjacent to the channel; bonding a metallization layer of the first transistor to a metallization layer of a second substrate; removing the sacrificial layer to remove the first substrate from the first transistor; forming contact trenches to access a side of the S/D regions opposite the second substrate; forming a contact resistance reducing layer on the side of the S/D regions opposite the second substrate, wherein the contact resistance reducing layer includes a dopant concentration that is at least 1E20 atoms per cubic centimeter (cm) greater in concentration than dopant concentrations of either of the S/D regions; and forming a contact layer in the contact trenches.

Example 37 includes the subject matter of Example 36, wherein the sacrificial layer is an etch-stop layer and wherein at least partially removing the sacrificial layer includes grinding the first substrate to near the etch-stop layer followed by at least one of an etch and polish process used to remove the remainder of the first substrate material.

Example 38 includes the subject matter of Example 36, wherein the sacrificial layer is a fast-etch layer and wherein at least partially removing the sacrificial layer includes a lateral etch of the fast-etch layer to allow for liftoff of the first substrate.

Example 39 includes the subject matter of Example 36, wherein the sacrificial layer is a multilayer stack including a fast-etch layer and an etch-stop layer and wherein at least partially removing the sacrificial layer includes a lateral etch of the fast-etch layer to allow for liftoff of the first substrate followed by at least one of an etch and polish process used to at least partially remove the etch-stop layer.

Example 40 includes the subject matter of any of Examples 36-39, wherein the contact resistance reducing layer includes composite material included in the S/D regions, but with greater concentration of at least one constituent of the composite material.

Example 41 includes the subject matter of any of Examples 36-40, wherein the contact resistance reducing layer includes one of n-type and p-type dopants.

Example 42 includes the subject matter of any of Examples 36-41, wherein the contact resistance reducing layer includes a dopant concentration of approximately equal to or greater than 5E20 atoms per cubic cm.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
a substrate;
a transistor above the substrate, wherein the transistor includes
a gate,
a first layer of single-crystal semiconductor material above the gate,
a source region or drain region adjacent to the single-crystal semiconductor material, wherein the source or drain region includes a first dopant concentration,
a contact layer above the source or drain region, and
a second layer between the contact layer and the source or drain region, wherein the second layer includes a second dopant concentration that is at least 1E20 atoms per cubic centimeter (cm) greater in concentration than the first dopant concentration;
at least one metallization layer below the transistor and between the transistor and the substrate; and
at least one metallization layer above the transistor.

2. The IC of claim 1, wherein the layer of single-crystal semiconductor material includes less than 1E8 dislocation or grain boundary defects per square cm.

3. The IC of claim 1, wherein the layer of single-crystal semiconductor material includes one or both of a group IV semiconductor material and a group III-V semiconductor material.

4. The IC of claim 1, wherein the transistor further includes a gate dielectric layer between the gate and the single-crystal semiconductor material.

5. The IC of claim 1, wherein the source or drain region includes a p-type dopant.

6. The IC of claim 1, wherein the first dopant concentration is approximately equal to or less than 5E20 atoms per cubic cm.

7. The IC of claim 1, wherein the contact layer includes one of a metal or metal alloy material.

8. The IC of claim 1, wherein the second layer includes one or both of a group IV semiconductor material and a group III-V semiconductor material.

9. The IC of claim 1, wherein the second layer includes composite material included in the source or drain region, but with greater concentration of at least one constituent of the composite material.

10. The IC of claim 1, wherein the second layer includes a p-type dopant.

11. The IC of claim 1, wherein the second dopant concentration is approximately equal to or greater than 5E20 atoms per cubic cm.

12. The IC of claim 1, wherein the second dopant concentration is at least 3E20 atoms per cubic cm greater in concentration than the first dopant concentration.

13. The IC of claim 1, further comprising a carbon doped layer between the second layer and the source or drain region.

14. The IC of claim 1, wherein the transistor includes one of a finned configuration or a nanowire configuration.

15. A complementary metal-oxide-semiconductor (CMOS) device comprising the IC of claim 1.

16. A computing system comprising the IC of claim 1.

17. An integrated circuit (IC) comprising:
a substrate;
a plurality of transistors above the substrate, wherein each of first and second transistors included in the plurality includes
a gate,
a channel layer above the gate,
a source region and a drain region adjacent to the channel layer, wherein the source region includes a first dopant concentration and wherein the drain region includes a second dopant concentration,
a contact layer above and/or below each of the source and drain regions, and
a contact resistance reducing layer between each contact layer and the corresponding source or drain region, wherein the contact resistance reducing layer includes a third dopant concentration that is at least 1E19 atoms per cubic centimeter (cm) greater in concentration than each of the first and second dopant concentrations;
at least one metallization layer below the plurality of transistors and between the plurality of transistors and the substrate; and
at least one metallization layer above the plurality of transistors.

18. The IC of claim 17, wherein the first transistor is an n-channel transistor and wherein the second transistor is a p-channel transistor.

19. The IC of claim 17, wherein there is a contact layer both above and below the source region and both above and below the drain region.

20. The IC of claim 17, further comprising a carbon doped layer between at least one contact resistance reducing layer and the corresponding source or drain region.

* * * * *